US010176969B2

(12) United States Patent
Miller

(10) Patent No.: US 10,176,969 B2
(45) Date of Patent: *Jan. 8, 2019

(54) METHOD FOR RAPID SWITCHING BETWEEN A HIGH CURRENT MODE AND A LOW CURRENT MODE IN A CHARGED PARTICLE BEAM SYSTEM

(71) Applicant: FEI Company, Hillsboro, OR (US)

(72) Inventor: Thomas G. Miller, Portland, OR (US)

(73) Assignee: FEI Company, Hillsboro, OR (US)

( * ) Notice: Subject to any disclaimer, the term of this patent is extended or adjusted under 35 U.S.C. 154(b) by 380 days.

This patent is subject to a terminal disclaimer.

(21) Appl. No.: 15/018,354

(22) Filed: Feb. 8, 2016

(65) Prior Publication Data

US 2016/0233053 A1    Aug. 11, 2016

Related U.S. Application Data

(63) Continuation of application No. 13/406,207, filed on Feb. 27, 2012, now Pat. No. 9,257,261.

(60) Provisional application No. 61/446,804, filed on Feb. 25, 2011.

(51) Int. Cl.
    H01J 37/30    (2006.01)
    H01J 37/305   (2006.01)
    H01J 37/147   (2006.01)

(52) U.S. Cl.
    CPC ...... *H01J 37/3053* (2013.01); *H01J 37/1472* (2013.01); *H01J 37/3005* (2013.01); *H01J 37/3056* (2013.01); *H01J 2237/049* (2013.01); *H01J 2237/0453* (2013.01); *H01J 2237/08* (2013.01); *H01J 2237/30472* (2013.01); (Continued)

(58) Field of Classification Search
    CPC ............... H01J 37/3005; H01J 37/3056; H01J 2237/31749; H01J 2237/31745; H01J 2237/0453
    USPC .......................... 204/192.34; 250/424, 492.2
    See application file for complete search history.

(56) References Cited

U.S. PATENT DOCUMENTS

| 5,149,976 A | 9/1992 | Sipma |
| 7,241,361 B2 | 7/2007 | Keller et al. |
| 7,442,942 B2 | 10/2008 | Takahashi et al. |

(Continued)

FOREIGN PATENT DOCUMENTS

| EP | 1526563 | 4/2005 |
| JP | 61080744 | 4/1986 |

(Continued)

*Primary Examiner* — Rodney G McDonald
(74) *Attorney, Agent, or Firm* — Scheinberg & Associates, P.C.; John B. Kelly

(57) ABSTRACT

A method for rapid switching between operating modes with differing beam currents in a charged particle system is disclosed. Many FIB milling applications require precise positioning of a milled pattern within a region of interest (RoI). This may be accomplished by using fiducial marks near the RoI, wherein the FIB is periodically deflected to image these marks during FIB milling. Any drift of the beam relative to the RoI can then be measured and compensated for, enabling more precise positioning of the FIB milling beam. It is often advantageous to use a lower current FIB for imaging since this may enable higher spatial resolution in the image of the marks. For faster FIB milling, a larger beam current is desired. Thus, for optimization of the FIB milling process, a method for rapidly switching between high and low current operating modes is desirable.

22 Claims, 22 Drawing Sheets

(52) U.S. Cl.
CPC ........... *H01J 2237/31745* (2013.01); *H01J 2237/31749* (2013.01)

(56) References Cited

U.S. PATENT DOCUMENTS

| | | |
|---|---|---|
| 8,253,118 B2 | 8/2012 | Zhang et al. |
| 2005/0279952 A1 | 12/2005 | Ishitani et al. |
| 2006/0045987 A1 | 3/2006 | Chandler et al. |
| 2006/0065854 A1 | 3/2006 | Shichi et al. |
| 2007/0069158 A1 | 3/2007 | Ohnishi |
| 2008/0314871 A1 | 12/2008 | Toth et al. |
| 2009/0309018 A1 | 12/2009 | Smith et al. |
| 2010/0243889 A1 | 9/2010 | Faber et al. |
| 2010/0294648 A1 | 11/2010 | Keller et al. |
| 2010/0301211 A1 | 12/2010 | Miller |
| 2011/0049382 A1 | 3/2011 | Miller et al. |
| 2011/0084207 A1 | 4/2011 | Zhang et al. |
| 2011/0163068 A1 | 7/2011 | Utlaut et al. |

FOREIGN PATENT DOCUMENTS

| | | |
|---|---|---|
| JP | 63086235 | 4/1988 |
| JP | 05015981 | 1/1993 |
| JP | 11077333 | 3/1999 |

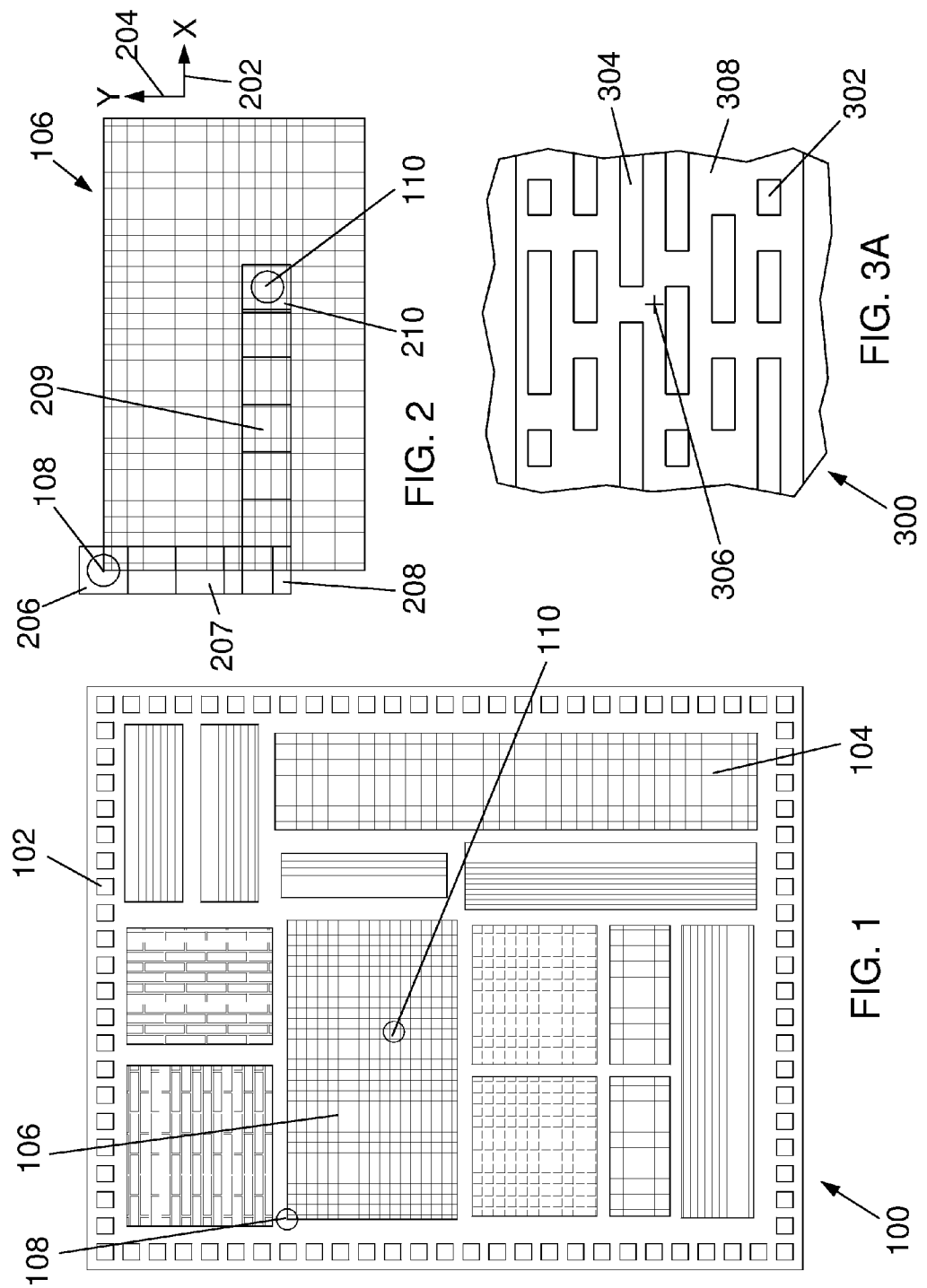

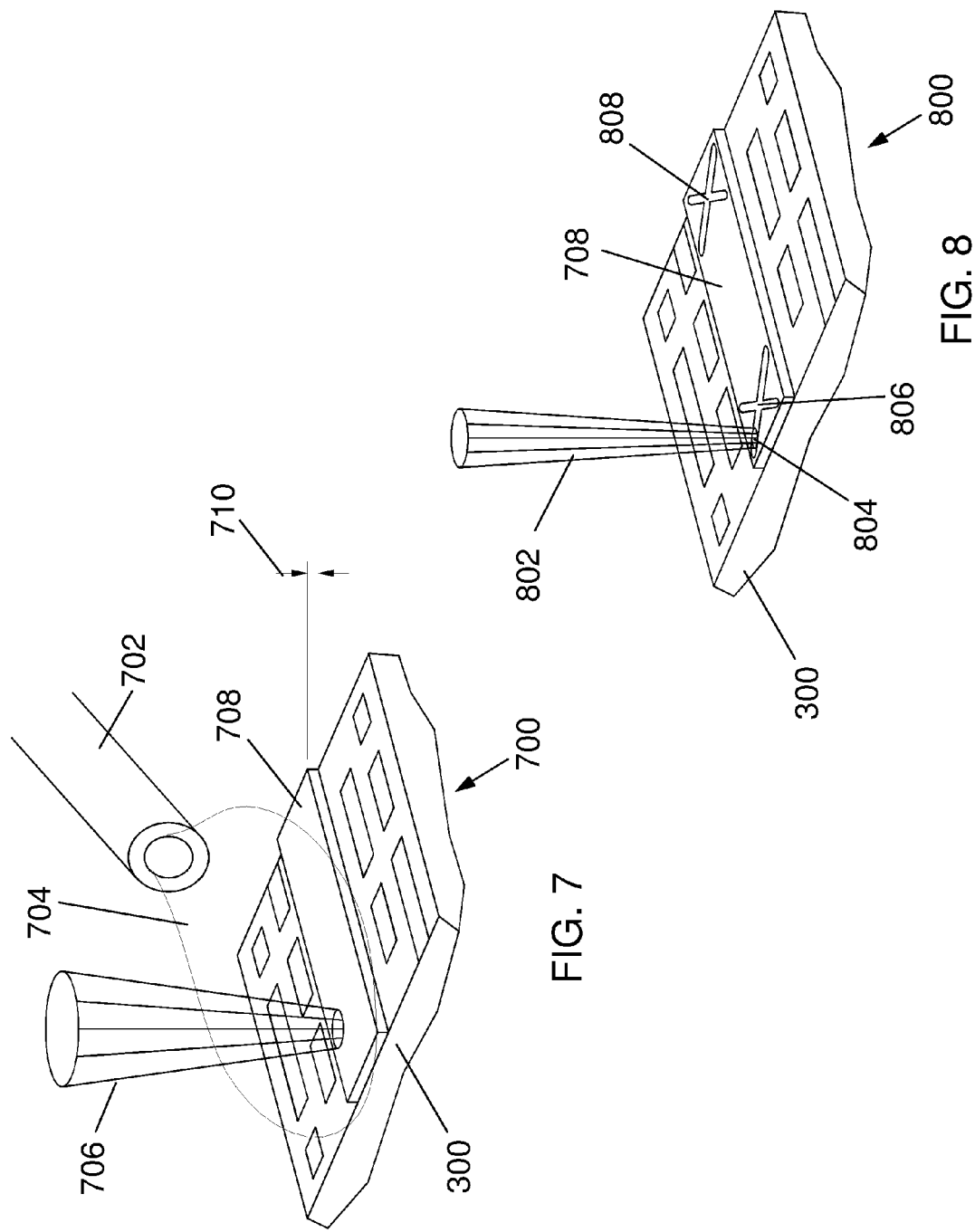

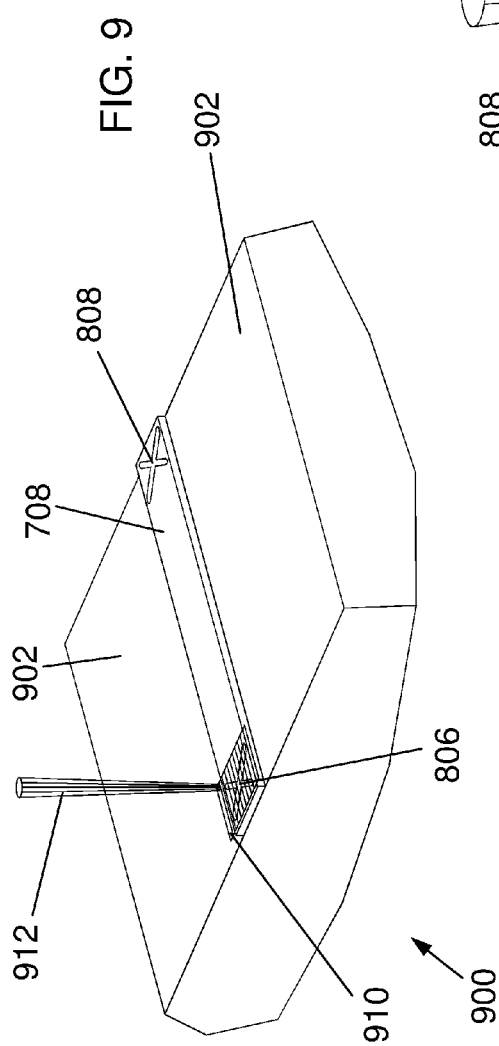
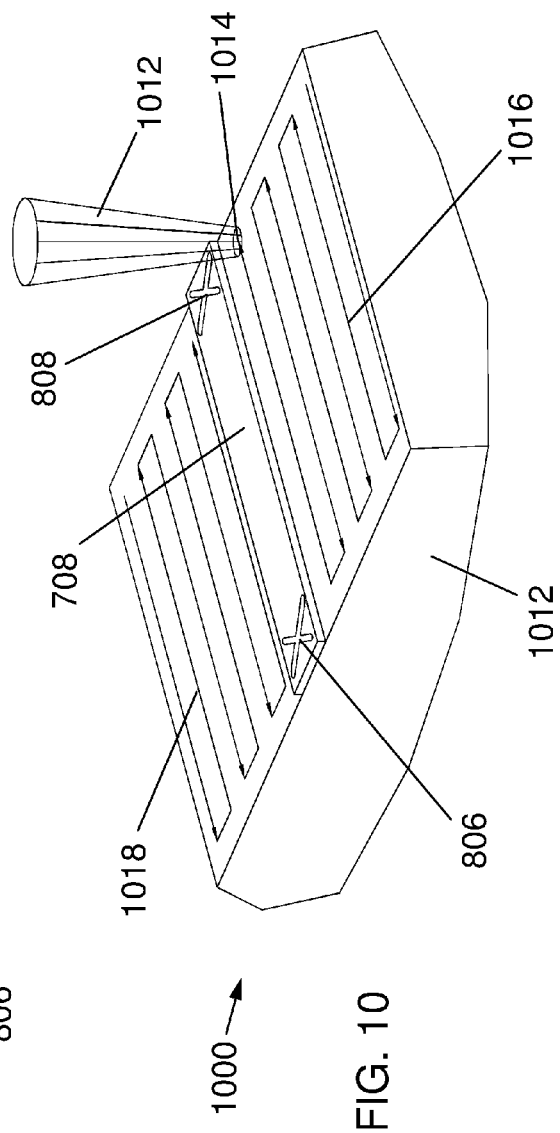

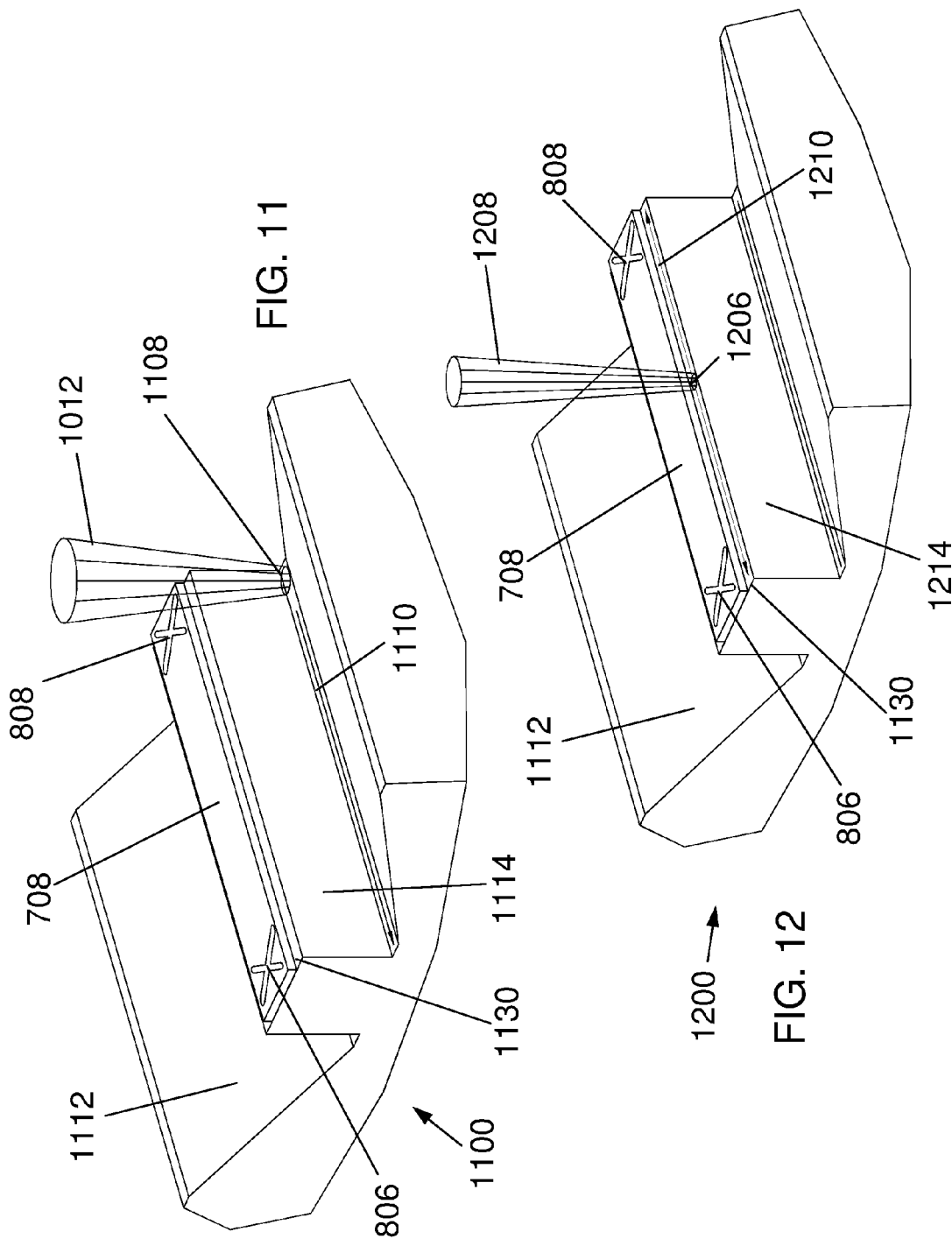

METHOD FOR RAPID SWITCHING BETWEEN A HIGH CURRENT MODE AND A LOW CURRENT MODE IN A CHARGED PARTICLE BEAM SYSTEM

This Application is a Continuation of U.S. patent application Ser. No. 13/406,207, filed Feb. 27, 2012, which claims priority from U.S. Provisional Application 61/446,804, filed Feb. 25, 2011, which are hereby incorporated by reference.

TECHNICAL FIELD OF THE INVENTION

The present invention relates generally to charged particle beam systems and in particular to rapid switching between operating modes with differing beam currents.

BACKGROUND OF THE INVENTION

In charged particle beam systems, such as electron microscopes or focused ion beam (FIB) systems, a column is typically used to focus a beam of charged particles onto the surface of a target to be imaged and/or processed. In a FIB column, an ion source (typically a liquid metal ion source, or LMIS) generates the initial beam of ions, which then passes into a "gun", which typically focuses these ions into a roughly parallel beam entering the main body of the column. In the column, this beam may be blanked (i.e., turned on and off), deflected (moved around on the target surface), and focused onto the surface of the target. In some cases, the ion beam is used to mill (sputter) material in controlled patterns from the surface of a target—in these applications, the milling rate is roughly proportional to the beam current, thus higher beam currents are generally preferred to improve process throughputs. In other cases, the ion beam is used to image a target, where the impact of the ion beam induces emission of secondary electrons which can be detected and used to form the image—in these applications, the image resolution is roughly determined by the beam diameter. A beam having a lower beam current can typically be focused to a smaller diameter than a beam having a greater current, and the lower beam currents results in less damage to the target. Although an ideal beam would have all the ions uniformly distributed within a desired beam diameter, in actuality, the beam current distribution is more or less bell-shaped and tapers off away from the beam center. The image contrast may be reduced if the focused ion beam has extended "tails".

Some applications require both imaging and milling. In particular, when a milled pattern needs to be precisely located with respect to a pre-existing feature on a target, it is necessary to first image the target with a lower current FIB, and then to switch to a higher current (typically larger diameter) FIB for milling. One important example of such an imaging/milling process is the preparation of thin "lamellae" (singular: "lamella") of various types of samples, such as semiconductor devices and cryo-frozen biological samples. In the case of semiconductor device failure analysis, a particular region of interest (RoI) within an integrated circuit, usually containing a defective device to be analyzed, is exposed by FIB milling on both sides, leaving a thin slice (lamella) of material remaining which contains the defective device—these lamellae are thin enough for use in high voltage transmission electron microscopes (TEMs) or scanning transmission electron microscopes (STEMs) where atomic resolutions are, in principle, available. Because the lamellae are only tens of nanometers thick, and the defects being observed may be on the scale of nanometers, the milling to create the lamella is extremely precise.

During preparation of a lamella, it is necessary to switch between using large current, large diameter beams suitable for rapid milling and using lower current, smaller diameter beams for fine milling or imaging. This is typically done by changing a beam-defining aperture (BDA) through which the beam passes. BDAs are typically holes in a metal strip, allowing only charged particles that pass through the hole to form the beam. There are typically several BDAs, or holes, in a metal strip, and switching apertures typically entails moving the strip so that a hole of a different diameter is positioned in the path of the beam. The mechanical movement of the aperture strip is typically accurate to only a few microns, so it has been considered necessary to realign the beam after changing apertures.

Changing apertures not only necessitated realigning the beam, but also adjustments to the lenses. The optical requirements for forming a large current, large diameter beam and a lower current, smaller diameter beam are not the same. FIG. 28 shows a graph of the logarithm of the spot size of the beam 2810 on a sample as a function of the logarithm of the beam convergence angle 2812. The convergence angle is the angular spread at the target of the ions that are formed into the beam. The aperture in the beam path determines the beam convergence angle—a larger aperture accepts charged particles from a wider angle.

The aperture size affects several properties of the beam. A larger aperture passes charged particles that are further away from the optical axis, thereby increasing spherical aberration (proportional to the cube of the convergence angle) in the beam and, as shown in line 2802, increasing the beam spot size, that is, the beam diameter at the sample. A larger aperture also increases the chromatic aberration (proportional to the convergence angle) as shown by line 2804.

Many charged particle systems form a spot on the sample by forming a demagnified image of the source and the spot size decreases with decreasing magnification (increasing demagnification) as shown by line 2806. The magnification of the optical system decreases with increasing convergence angle. Thus, increasing the convergence angle affects the aberrations and the source demagnification, the aberration tending to increase the spot size with increasing convergence and the source demagnification tending to decrease the spot size with increasing convergence angle.

FIG. 28 shows the combined effects 2808 of spherical aberration, chromatic aberration, and source demagnification on the spot size as the convergence angle changes. At the beam settings for the graph in FIG. 28, the smallest spot size A at the low point of curve 2808 is produced at beam convergence angle B. FIG. 28 shows that if a larger or smaller aperture were used, increasing or decreasing the convergence angle, the spot size would increase, moving away from the low spot in the curve 2808. To return to a more ideal spot size, FIB users would change the lens voltages when changing apertures, to change the magnification and return the beam spot size to a new low point in a modified curve.

Thus, in the prior art, switching between a high current mode and a low current mode has required not only switching of beam-defining apertures, but also realigning the beam and changing numerous lens voltages in order to separately optimize the column ion optics for each of these two modes. Unfortunately, since some column voltages may need to change by substantial amounts (>100 V), long power supply settling times may be required when changing between modes before a column is ready to function, e.g., when switching back-and-forth between milling and imaging. Thus it would be desirable to reduce the switching times between milling and imaging modes in order to improve throughput in the preparation of thin lamellae.

SUMMARY OF THE INVENTION

An object of the invention is to provide more rapid switching between a higher current mode and a lower current mode in charged particle beam systems.

In some embodiments, the present invention improves processing speed by avoiding changes to lens voltages that would be sufficiently great to require substantial settling times when changing the beam-defining aperture during a transition between high current and low current modes. In some embodiments, the present invention avoids repositioning a beam after changing a beam defining aperture.

For example, one could change from a high current focused ion beam milling mode and low current focused ion beam imaging mode without changing any of the power supply voltages and without changing the default beam position. The invention is particularly useful in preparation of lamella for viewing in a transmission electron microscope because lamella preparation can use multiple beam current levels of a focused ion beam and because it is desirable to reduce the time required to prepare each lamella.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 1 shows a schematic view of an integrated circuit, including a cache memory and a defective cell.

FIG. 2 shows a close up view of the cache memory from FIG. 1, including a defective cell.

FIG. 3A shows a close up top view of the defective cell from the cache memory in FIG. 2.

FIG. 7 shows an isometric schematic view of a FIB assisted deposition process at the defective cell in FIG. 3A, forming a thin protective deposition as in some embodiments of the present invention.

FIG. 8 shows an isometric schematic view of a FIB milling process to form two fiducial marks in the thin deposition formed in FIG. 7 for an embodiment of the present invention.

FIG. 9 shows a FIB imaging process for the FIB-milled fiducial marks in the thin deposition formed in FIG. 7 for an embodiment of the present invention.

FIG. 10 shows the beginning of a FIB box milling process.

FIG. 11 shows the completion of a FIB box milling process.

FIG. 12 shows a FIB cleaning process.

DETAILED DESCRIPTION OF PREFERRED EMBODIMENTS

More rapid switching between high and low currents in a charged particle beam can facilitate alternating between processing and imaging operations and therefore can enable higher throughput, precise processing of targets.

One application for such a process is the fabrication of lamellae from samples to enable high spatial resolution imaging in TEMs or STEMs. In particular, recent advances in the semiconductor industry, as it follows Moore's Law to ever smaller device geometries, have necessitated a switch from the use of scanning electron microscopes (SEMs) for device failure analysis to the use of higher resolution TEMs and STEMs. Thus, it has become necessary to perfect means for preparing semiconductor devices for TEM or STEM analysis. This involves the preparation of lamellae fabricated using FIBs by a milling process which cuts down through the device on each side of a region of interest (RoI) containing a device which is to be analyzed, often due to a device failure.

Focused ion beam systems typically comprise a column which focused ions emitted from an ion source (usually a liquid metal ion source, or LMIS) onto the surface of a target. Control of the focusing column involves the setting of a number of electrode voltages, thereby controlling the strengths of lenses, blankers, and deflectors which focus, turn on/off, and deflect the focused on beam at the target. In addition, the amount of current reaching the target is typically controlled by the selection (either mechanically or electrically) of a beam-defining aperture (BDA). In the prior art, the column has generally been optimized separately for the milling and imaging processes by selecting the optimum BDA, changing various voltages, and repositioning the beam—This optimization process can take a considerable time since it is necessary for lens voltages to stabilize before either milling or imaging can be performed. Often, the BDA selection process is faster than the power supply settling times.

Figure 29:
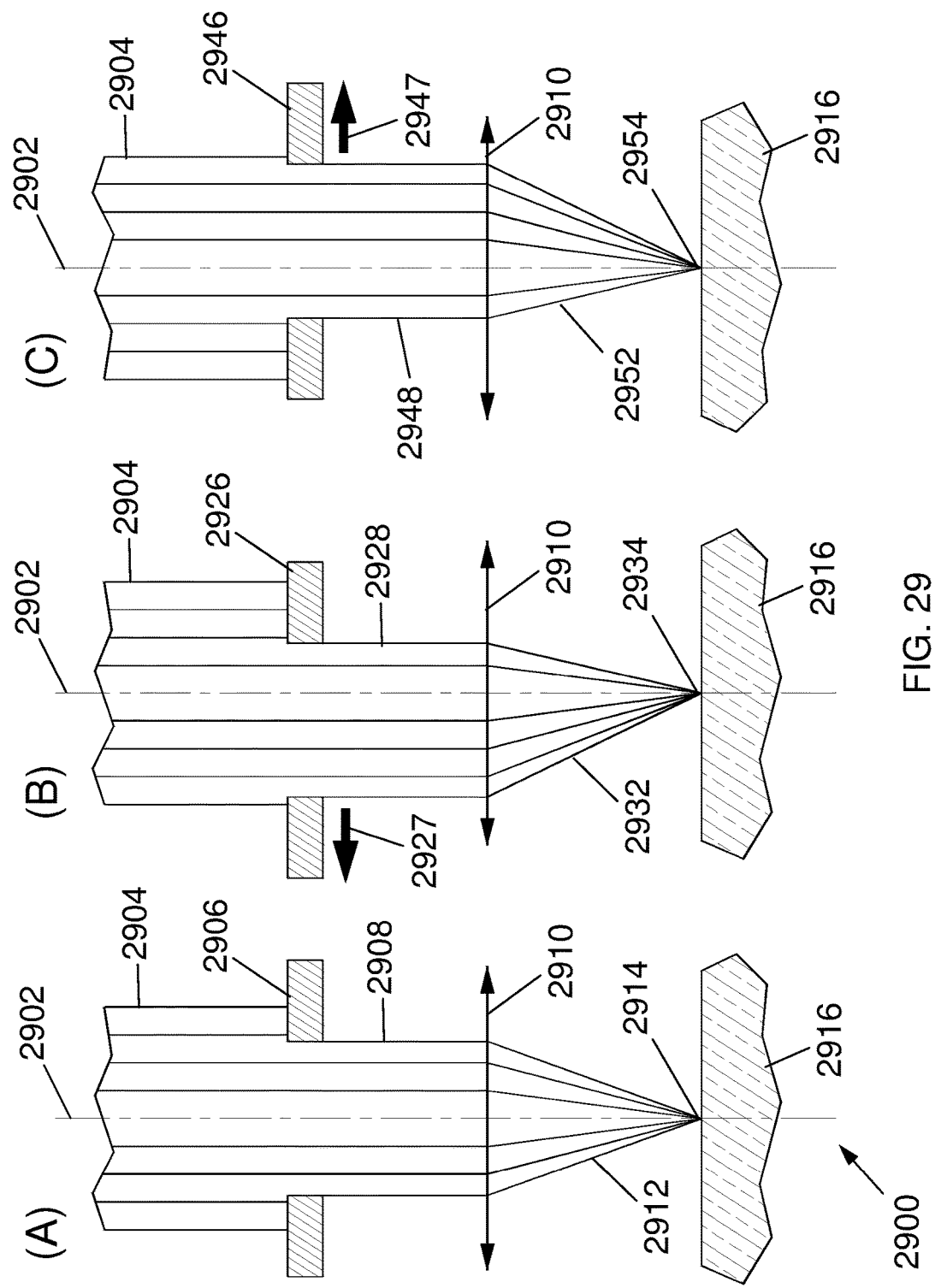
FIG. 29 shows schematically the effect of different aperture positions on beam position in an ideal system.

Moreover, applicants realized that a small shift in the position of the BDA did not cause an equal shift in the beam position because ideally the lens still tends to focus the charged particles at the same point. FIG. 29 shows three views 2900 of a charged particle column focusing a beam onto a substrate 2916. In view (A), a column (not shown) with an axis 2902 has generated an on-axis charged particle beam 2904 which is illuminating an on-axis (aligned) aperture 2906 to produce an on-axis apertured beam 2908. Beam 2908 is focused to a location 2914 on the surface of target 2916 by lens 2910, forming focused beam 2912. In view (A), because aperture 2906 is centered on the column axis 2902, the illumination of aperture 2906 is symmetrical on both sides of the axis 2902.

In view (B) of FIG. 29, the same column as in view (A) is shown with an off-axis (misaligned) aperture 2926 as indicated by offset arrow 2927. Aperture 2926 is illuminated by the same beam 2904 as in view (A), producing an off-axis apertured beam 2928, displaced to the left side of the column axis 2902. As a result of this misalignment of aperture 2926 with respect to the column axis 2902, beam 2928 is off-axis entering lens 2910, which has the same settings as in view (A). As a result of beam 2928 being off-axis, focused beam 2932 is tilted with respect to the surface of target 2916, as shown. In the case of no aberrations in lens 2910, location 2934 will be the same as location 2914 in view (A). With the level of aberrations in lens 2910 for a typical charged particle column, with misalignments of aperture 2926 in a typical range of 5 to 10 μm, the displacement of location 2934 with respect to location 2914 may generally not exceed few nm, an acceptable locational error for many beam processing applications.

View (C) of FIG. 29 shows a misaligned aperture 2946 with a displacement vector 2947 in the opposite direction from displacement vector 2927 in view (B). All the same considerations apply in view (C) in comparison with view (B)—off-axis beam 2948 illuminates lens 2910 such that focused beam 2952 is tilted in the opposite direction from focused beam 2832 in view (B). Location 2954 should also be within a few nm of location 2914, assuming typical misalignments of aperture 2946 in the 5 to 10 μm range. Applicants have verified these beam shift predictions to be negligible for many applications.

Some embodiments of the invention avoid delays due to power supply settling times by only changing the BDA during transitions back and forth between FIB milling and FIB imaging, but not changing any of the power supply voltages and not realigning the beam. The advantages and disadvantages of this simplified method of various embodiments of the present invention are discussed below. The ion optical performance of a typical FIB column is characterized in detail for both the slower prior art fully optimized processes, and for the faster non-optimized processes of some embodiments of the present invention. A flowchart for a two-step FIB milling/imaging method is provided, along with an overall description of a lamella preparation procedure.

Some embodiments of the present invention use focused ion beam (FIB) systems employing focused ion beams to image and mill a target. These systems typically employ a liquid metal ion source (LMIS) to form an initial ion beam which is then accelerated, focused, blanked, and deflected by electrostatic elements within the FIB column such as lenses, blankers, and deflectors. The lens voltage and position can be optimized, for example, for a large aperture, a small aperture, or somewhere in between the actual apertures used in the process. In the later case, while the beam is not optimized for any of the actual operations, but the beam is closer to being optimized for all operations. The choice of optimization will depend on the application.

Location of a Region of Interest (RoI) on a Target

FIG. 1 shows a schematic view of an integrated circuit (IC) 100, comprising a defective cell 110 within a cache memory 106—the area of the IC containing the defective device (a cell in this example) is often called a "Region of Interest" (RoI). Around the perimeter of the IC 100 are typically a large number of connection pads 102. Other areas of the IC 100 may comprise logic 104 or input/output circuits. Manufacturers often need to diagnose malfunctions in ICs by examination of the defective devices within RoIs, in this example, cache memory cell 110. Since IC devices are three-dimensional structures, comprising multiple patterned layers of conductors, semiconductors and insulators, this examination process may require milling into the device to expose underlying layers, often using a focused ion beam (FIB), such as a $Ga^+$ ion beam, as could be produced by the FIB column illustrated in FIG. 13. In the prior art, a FIB mill from one side of the RoI was followed by a scanning electron microscope (SEM) examination of the revealed device structure to determine the source of the defective device operation, such as contamination between a contact and a transistor gate, an incomplete via connection between layers of an interconnect metallization, etc. As IC dimensions have continued to shrink at a rate of about 40% every two to three years with the progress of Moore's Law, it has become increasingly difficult to achieve the necessary imaging resolutions needed to see the defective devices using SEMs. Thus, the semiconductor industry has increasingly turned to transmission electron microscopes (TEMs) having higher spatial resolutions than SEMs for imaging of RoIs in ICs. SEMs typically image surfaces using secondary and backscattered electrons, thus the device structures could be made visible with single cuts at one side of the RoI. TEMs, on the other hand, image electrons which have been transmitted through the sample. Thus, for TEM examination of defective devices, it is necessary to mill on both sides of the RoI, creating a "lamella" or thin slice downwards through the sample, typically 5 to 15 µm deep, and with a lamella thickness ranging below 100 nm.

FIG. 2 shows a close up view of the cache memory 106 from the IC 100 in FIG. 1, including a defective cell 110, and a coordinate system with X-axis 202 and Y-axis 204, corresponding to the X-Y orientation of cells within memory 106. Like essentially all memories, cache memory 106 may comprise a large number (>$10^5$) of cells, each storing a single bit in a flip-flop circuit comprising a small number (often six) of transistors. This large number of memory cells is usually arranged in an X-Y array, in which the cells typically are identical (commonly configured in four mirror-imaged orientations) as viewed from the top of the IC 100. Thus, if the RoI containing the defective cell 110 is somewhere out in the middle of the memory 106, it may be difficult to locate the RoI, since the device defects will usually not cause any distinctive pattern on the surface. For example, an incomplete contact plug for a transistor gate would be completely buried beneath a number of interconnect metal layers, alternating with dielectric insulation layers. This is why diagnosing the source of the device defect usually requires milling down vertically to expose these buried layers. A consequence of this fact is that the only way to position the RoI under the FIB for milling is to perform a prior art process called "bit walking", as illustrated in FIG. 2 and outlined in the flowchart 2700 in FIG. 27.

To perform bit walking, the lamella preparation system is first set up for imaging of the IC 100. This may involve the use of an internal SEM column, or a FIB column configured with a lower beam current and smaller beam diameter to provide high spatial resolution imaging of the sample surface. The imaging signal usually employs secondary or backscattered electrons generated by the impact of the electron or ion beam with the sample surface—this may be termed the "imaging beam." After insertion of the target into the system in block 2702 of the flowchart 2700 of FIG. 27, followed by pumping down in a loadlock and subsequent loading onto a stage in block 2704, the sample is positioned under the FIB column in block 2706. The FIB column is set-up for imaging in block 2708—this may comprise setting various accelerating, focusing, blanking and deflecting voltages on various electrodes of the FIB column, such as that illustrated in FIG. 13. In block 2710, a small diameter beam-defining aperture (BDA) is mechanically or electrically selected to restrict the focused ion beam to a small half-angle as subtended at the emitter tip, and thus a smaller total beam current. BDAs may be mechanically selected in systems in which a number of BDAs are mounted within a movable "aperture strip"—this strip is movable with respect to the column axis to position any one of the BDAs contained therein on the column axis, typically to within 5 to 20 µm. Alternatively, BDAs may be electrically selected in systems in which two sets of aperture alignment deflectors are positioned, one above, and one below, an array of BDAs (not necessarily a linear array—the BDAs can be in any arrangement). In this electrical selection scheme, the beam may be moved off-axis by the upper deflector to pass through one of the BDAs, and then moved back on-axis by the lower deflector. Mechanical BDA selection has the advantage of less effect on the column optics since deflection aberrations are avoided. Electrical BDA selection has the advantages of being faster, with no chance of mechanical failure, and less likelihood of particle generation.

Now, this low current imaging beam is raster scanned 206 in FIG. 2 at the upper right corner (the "origin") 108 of the cache memory 106 to form an image in block 2712. From previous electrical testing of the IC 100, it is assumed that the exact X-Y coordinates of a defective memory cell 110 within the cache memory 106 are known. In general, since there are so many cells within memory 106, both the X- and Y-coordinates of cell 110 may be very large (>100 in most cases). In almost all cases, the defective cell 110 will not be close enough to the cache memory coordinate system origin 108 to acquire a single image comprising both the origin 108 and the RoI 110—thus, when block 2714 is first encountered, the FIB will not be over the RoI, so that path 2716 is followed to block 2718, and the IC 100 is moved by the stage in the direction of the RoI. This bit walking procedure was developed in the prior art to utilize a sequence of overlapping images on the cache memory 106 as shown in FIG. 2, including the initial raster 206 which images the origin 108. The raster scans 207 illustrate subsequent imaging of the memory 106 in block 2712, after following path 2720 out of block 2718. Note that for simplicity in this example, raster scans 207 extend straight downwards from the initial raster 208—this is not necessary, and neighboring raster scans 207 could be displaced both downwards and to the right in this example to reduce the total number of raster scans needed to span the distance across memory 106 from the origin 108 to the RoI 110.

Raster scan 208 is at the Y-position of RoI 110, but is displaced to the left, as shown in FIG. 2. Thus additional scans 209, moving to the right towards final raster 210 enclosing defective cell 110 are necessary in block 2712 of FIG. 27. As raster scans 206-210 are acquired, it is necessary to carefully count the number of memory cells contained within each image, and to account for overlap between neighboring images so that a proper accounting of the total number of cells vertically in Y (rasters 206-208), and then horizontally in X (rasters 208-210) is recorded. Once the IC 100 has been moved by the stage (not shown) to position the FIB raster 210 over the defective cell 110, then decision block 2714 results in a "Yes" response, and path 2722 is followed to block 2724, corresponding to the FIB milling process in FIG. 26 (see below).

FIG. 3A shows a close up top view as would appear within an image such as raster 210. An area 300 of IC 100 is shown, containing the RoI 110 from the cache memory 106 in FIGS. 1 and 2. Surface location 306 (the "+" mark is for illustrative purposes only and would not be visible on a real device) is directly above the defective cell 110. Typical features which would be visible include longer interconnects 304, shorter connections 302, and insulating areas 308.

Figure 3B:
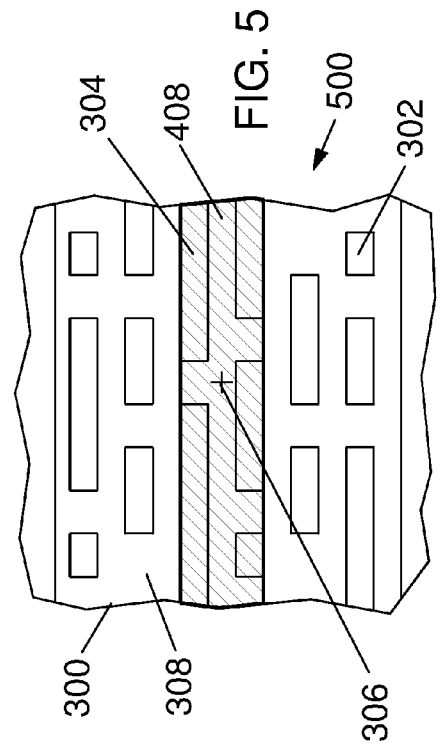
FIG. 3B shows a close up isometric view of the defective cell in FIG. 3A.

FIG. 3B shows a close up isometric view of the region of IC 100 illustrated in the top view of FIG. 3A.

Figure 4:
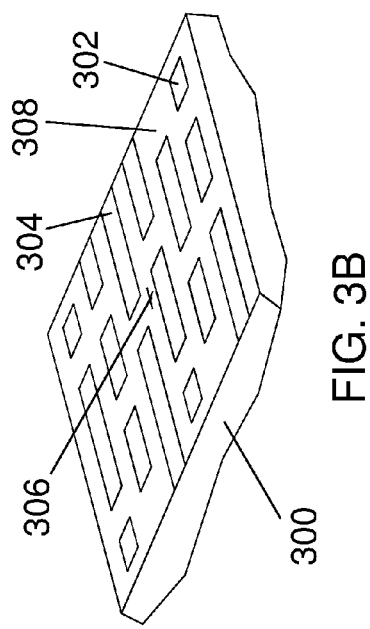
FIG. 4 shows an isometric schematic view of a FIB-assisted deposition process at the defective cell in FIGS. 3A and 3B, forming a thick protective deposition as in the prior art.
Figure 27:
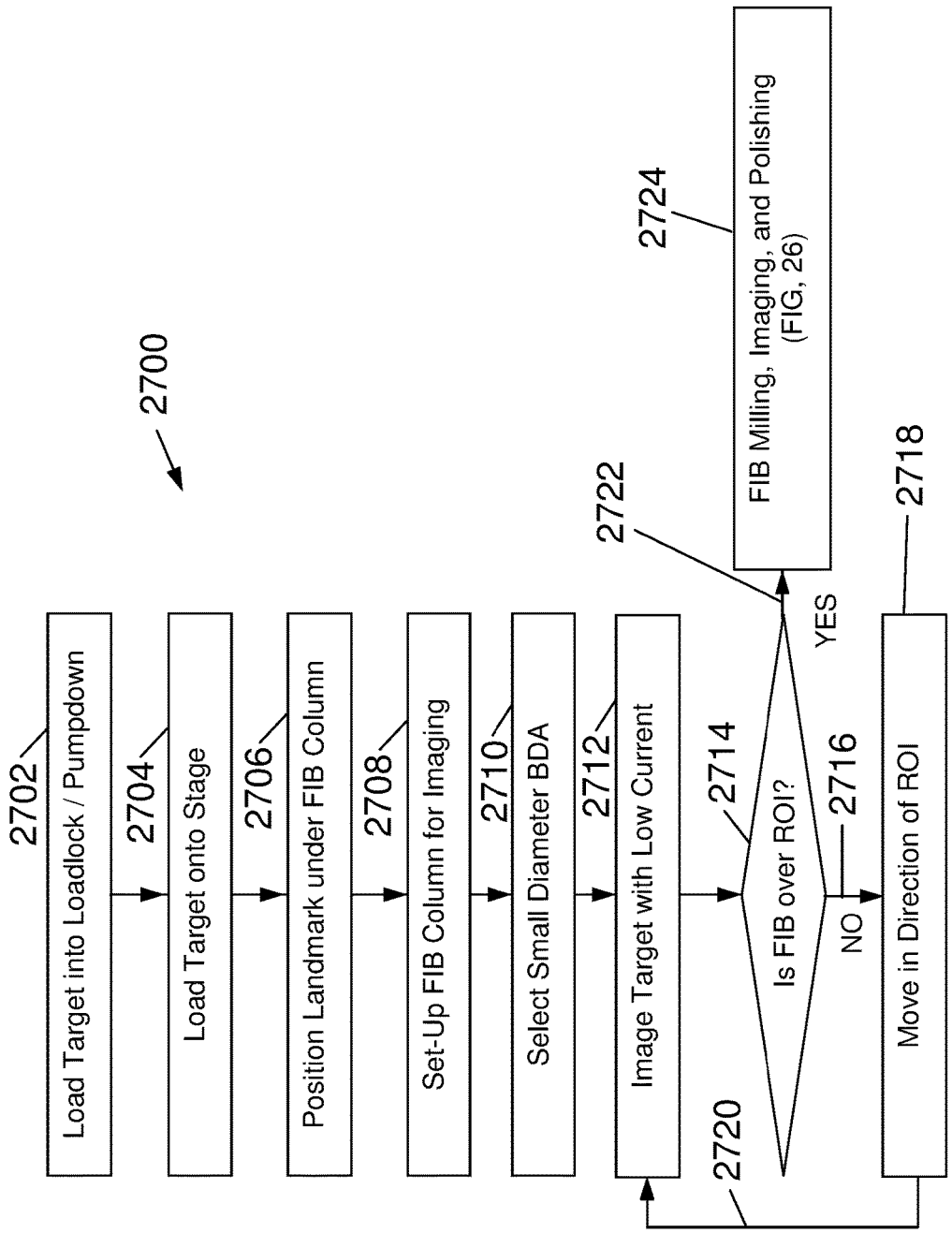
FIG. 27 is a flow chart for a "bit walking process" for positioning a region of interest (RoI) under the focused ion beam prior to performing the imaging and FIB milling process in FIG. 26.
Figure 28:
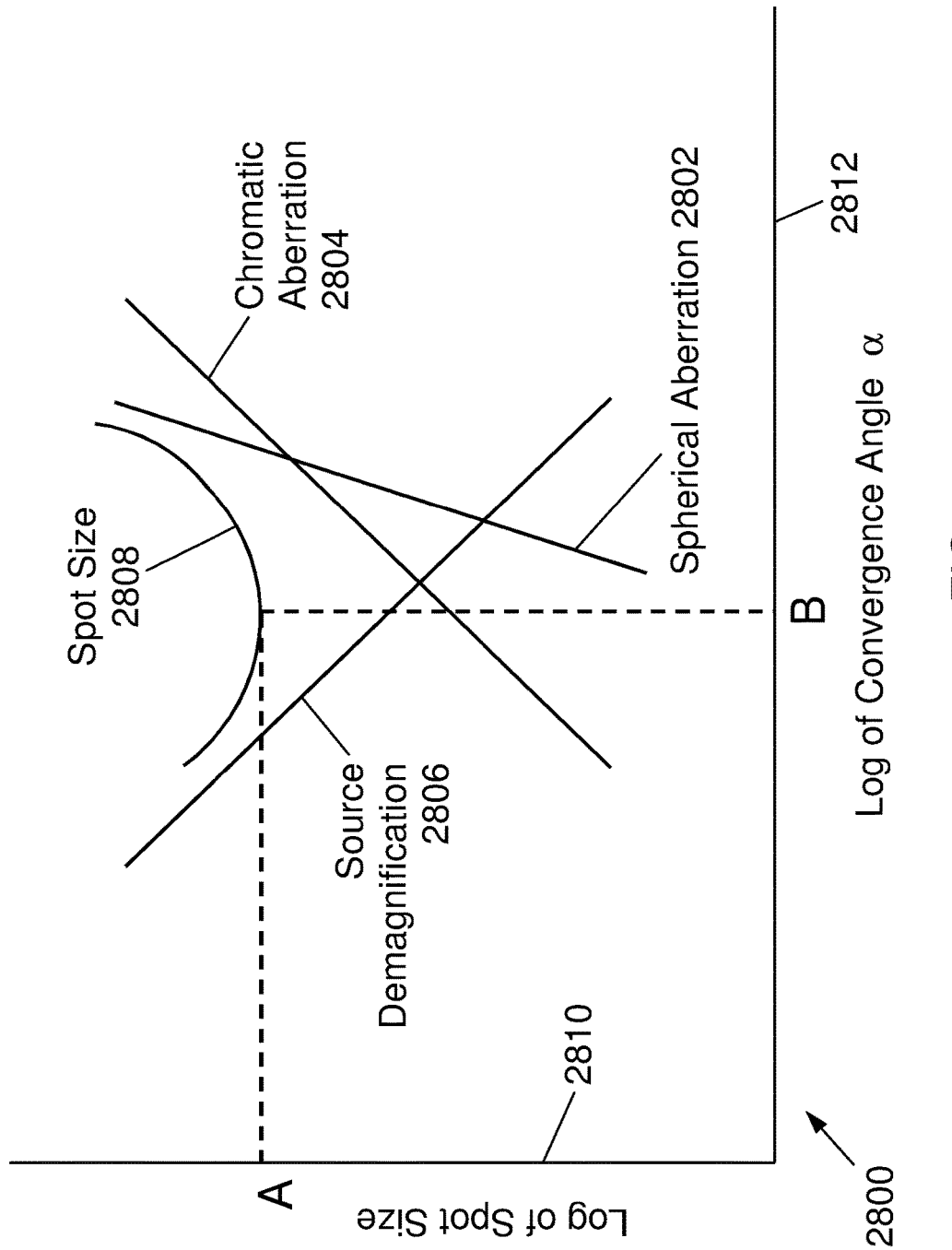
FIG. 28 is a graph of the logarithm of the spot size of the beam on a sample as a function of the logarithm of the beam convergence angle.

Formation of a Protective Structure and Fiducial Marks at the RoI in the Prior Art Now that the RoI within the target has been positioned under the FIB column in FIGS. 2 and 27, the process of lamella preparation can begin. FIG. 4 shows an isometric schematic view 400 of a FIB-assisted deposition process at the RoI in FIGS. 3A and 3B, forming a thick protective deposition 408 as in the prior art. A gas injector nozzle 402 is positioned near the location where the focused ion beam (FIB) 406 impacts the surface of the target IC 100. A cloud of deposition precursor gas 404 emerges from the end of the nozzle 402, resulting in adsorption of the precursor gas 404 onto the surface of the IC 100 both at, and surrounding, the location 306 on the target surface directly above the defective cell 110. As the FIB 406 is scanned across the target surface, there is an interaction between the FIB 406 and the precursor gas 404 to form a thick deposition 408, as shown in the "x-ray" top view in FIG. 5. Typically, this thick deposition 408 would be oriented parallel to the planned walls of the lamella to be prepared—the two ends of the deposition 408 may be used for milling fiducial marks as shown in FIG. 6, or, alternatively, additional thick depositions (not shown) spaced away from the ends of deposition 408 may also be deposited. The purposes of deposition 408 are 1) to protect the underlying device layers from inadvertent milling which might arise from the "tails" of the focused ion beams used for milling (see FIGS. 10-12) and 2) to provide material in which local fiducial marks can be milled (see FIG. 6).

Figure 5:
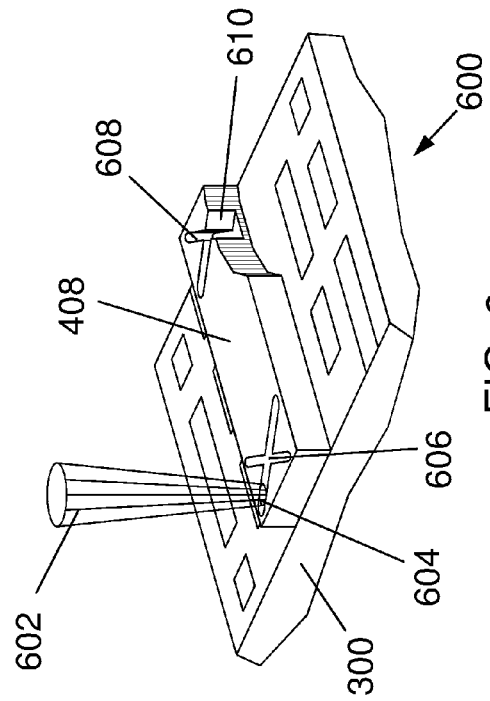
FIG. 5 shows a top x-ray schematic view of the thick deposition from the process illustrated in FIG. 4.
Figure 6:
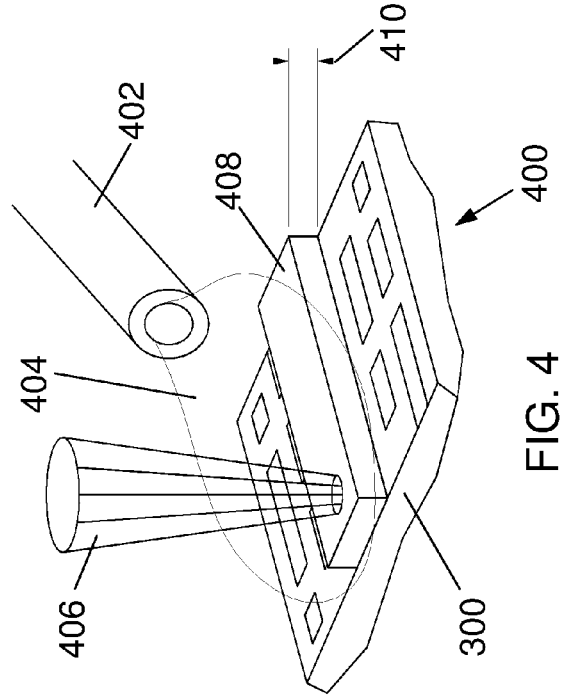
FIG. 6 shows an isometric schematic view of a FIB milling process to form two fiducial marks in the thick deposition formed in FIG. 4 for the prior art.

FIG. 5 shows a tip x-ray schematic view 500 of the thick deposition 408 from the process illustrated in FIG. 4, shown in the same direction as in FIG. 3A.

FIG. 6 shows an isometric schematic view 600 of a FIB milling process to form two fiducial marks 606 and 608 in the thick deposition 408 formed in FIG. 4 for the prior art. A FIB 602 is shown impacting the deposition 408 at a location 604. The FIB 602 is moved in a controlled pattern to mill mark 606 at the lower left end of deposition 408. Another mark 608 has previously been milled at the upper right end of deposition 408. A cutaway view of mark 608 illustrates two key requirements for the depth of the fiducial marks: 1) the marks should be as deep as possible within deposition 408, but 2) the marks should not break through into the underlying device layers, as this might damage the defective device, making it impossible to diagnose the cause of device failure (since the device would also be damaged by the FIB). For the prior art, deposition 408 must be fairly thick to prevent excessive loss of material during imaging scans required for beam realignment during milling to form the lamella. Thick depositions 408 necessarily require both longer deposition times in FIG. 4, and longer milling times for fiducial marks 606 and 608 in FIG. 6. The reason for thicker depositions is that in some prior art systems, the same FIB is used for milling and imaging, thus the imaging beam current will be substantially higher than for some embodiments of the present invention.

Formation of a Protective Structure and Fiducial Marks at the RoI in an Embodiment of the Present Invention The modified deposition and milling procedures for one embodiment of the present invention are illustrated in FIGS. 7 and 8. As will be discussed below, some embodiments of the present invention may employ lower beam current focused ion beams for imaging of the fiducial marks, and thus there would be a correspondingly reduced amount of loss in material from the deposition over the RoI. FIG. 7 shows an isometric schematic view 700 of a FIB assisted deposition process at the RoI in FIGS. 3A and 3B, forming a thin protective deposition 708 in an embodiment of the present invention. A gas injector nozzle 702 is positioned near the location where the focused ion beam (FIB) 706 impacts the surface of the target IC 100. A cloud of deposition precursor gas 704 emerges from the end of the nozzle 702, resulting in adsorption of the precursor gas 704 onto the surface of the IC 100 both at, and surrounding, the location 306 on the target surface directly above the defective cell 110. As the FIB 706 is scanned across the target surface, there is an interaction between the FIB 706 and the precursor gas 704 to form a thin deposition 708—from the perspective of the "x-ray" top view in FIG. 5, deposition 708 could cover the same areas of IC 100 as for the prior art deposition 408 in FIG. 4. Typically, this thin deposition 708 would be oriented parallel to the planned walls of the lamella to be prepared—the two ends of the deposition 708 may be used for milling fiducial marks as shown in FIG. 8, or, alternatively, additional thin depositions (not shown) spaced away from the ends of deposition 708 may also be deposited. The purposes of deposition 708 are the same as those for deposition 408 in the prior art: 1) to protect the underlying device layers from inadvertent milling which might arise from the "tails" of the focused ion beams used for milling (see FIGS. 10-12), and 2) to provide material in which fiducial marks 806 and 808 can be milled (see FIG. 8).

FIG. 8 shows an isometric schematic view 800 of a FIB milling process to form two fiducial marks 806 and 808 in the thin deposition 708 formed in FIG. 7 for an embodiment of the present invention. A FIB 802 is shown impacting the deposition 708 at a location 804. The FIB 802 is moved in a controlled pattern to mill mark 806 at the lower left end of deposition 708. Another mark 808 has previously been milled at the upper right end of deposition 708. The same two key requirements for the depth of the fiducial marks 806 and 808 apply here for an embodiment of the present invention as for the marks 606 and 608 in FIG. 6 for the prior art: 1) the marks should be as deep as possible within deposition 708, but 2) the marks should not break through into the underlying device layers, as this might damage the defective device, making it impossible to diagnose the cause of device failure (since the device would also be damaged by the FIB). For some embodiments of the present invention, deposition 708 may be substantially thinner than deposition 408 since lower FIB currents may be used for imaging of fiducial marks 806 and 808 than might be the case for imaging of fiducial marks 606 and 608 in the prior art. Since the imaging currents are lower, the resultant inadvertent FIB milling rates of the marks during image are correspondingly reduced, thus less material is milled away during imaging. Thin depositions 708 enable both shorter deposition times in FIG. 7, and shorter milling times for fiducial marks 806 and 808 in FIG. 8.

Box Milling Process

FIG. 9 shows a FIB imaging process 900 for the FIB-milled fiducial marks 806 and 808 in the thin deposition 708. An imaging focused ion beam 912 is scanned, typically in an X-Y raster pattern, across both of the fiducial marks 806 and 808 (scanning of mark 806 is illustrated). As the FIB scans across the mark 806, secondary electrons (SEs) are emitted and collected by an SE detector to form an image. Image processing can then be used to find the exact location of the mark 806, for example, the position of the mark could be defined to be the center of the "X" pattern, as shown. Areas 902 will be milled away in the box milling process in FIGS. 10 and 11.

FIG. 10 shows the beginning of a FIB box milling process 1000. "Box" milling is a term for the process of cutting large (~5 to 20 µm) trenches at each side of the RoI containing the device to be analyzed. A larger current focused ion beam 1012 is scanned in the pattern 1016 at the side of the deposition 708, striking the surface at location 1014. The material 1012 will be milled away by the beam 1012, as shown in FIG. 11. After milling on one side of the deposition 708, a similar box milling pattern 1018 is executed on the other side of the deposition 708. Details of the beam scanning process are known; however it is clear from FIG. 11 that the FIB 1012 must necessarily dwell longer over portions of areas 902 nearer to deposition 708, than over areas farther away—this strategy generates the triangular trenches shown in FIG. 11.

FIG. 11 shows the completion of a FIB box milling process 1100, creating triangular trenches on each side of the deposition 708. The impact of beam 1012 at area 1108 has carved a trench roughly 5 to 15 µm deep and a similar distance across (width). A roughly vertical wall 1114 has been exposed above the bottom 1110 of the trench. Note that there is a gap 1130 between the wall 1114 and the edge of the deposition 708—this allows for subsequent finer milling and polishing steps, enabling high precision (2-4 nm) positioning of the final wall of the lamella with respect to the device to be analyzed within the RoI. In some cases, the box milling process may be interrupted one or more times to allow switching back to an imaging beam, and a rescan of the fiducial marks 806 and 808, as in FIG. 9—this ensures that any drifts of the target with respect to the FIB column will not cause the milling beam to strike the RoI, thereby damaging the device to be analyzed.

Cleaning Milling Process

FIG. 12 shows a FIB cleaning process 1200, typically following the box milling process in FIGS. 10-11. Now a smaller FIB with less current 1208 strikes the surface at a location 1206 to mill away the wall 1114, until a final wall 1214 exposing the defective device has been created. In some cases, the cleaning milling process may be interrupted one or more times to allow switching back to an imaging beam and a rescan of the fiducial marks 806 and 808, as for the box milling process in FIGS. 10-11. In this milling process, the beam 1208 is moved back and forth 1210 across the protruding material 1130 left after the box milling process as described in FIG. 11.

Multi-Step Imaging and Milling Processes of the Prior Art and an Embodiment of the Present Invention In the prior art, the parameters for the FIB column were typically optimized both for imaging and milling—this involves setting of various electrode voltages within the column, as well as selection (mechanically or electrically—see above) of the beam-defining aperture (BDA). Table I summarizes the type of column set-up (optimized or non-optimized) and the application for each of six system operating modes A to F. In this case, "optimized" means that both the column voltages and BDAs have been selected to maximize the beam current density by minimizing the beam diameter at the target. "Non-optimized" means that only the BDA has been changed, but no column voltages have been changed, thus the resultant beam current density is lower since the beam diameter is larger than optimal. For example, modes B or C could be used in some embodiments of the present invention for coarse imaging which would not have quite the spatial resolution of mode D in the prior art, but where intermode switching (A↔B or A↔C) would be much faster because it would not be necessary to wait for the column voltage supplies to settle. Similarly, in some embodiments of the present invention, optimized mode D might be used for fine milling, alternating with non-optimized mode E for fine imaging—this contrasts with the prior art where optimized mode D would alternate with optimized mode F, requiring changes in column voltages and BDAs when switching (D↔F).

Table II outlines how the various operating modes A-F in Table I may be combined in dual-mode process steps, both in the prior art (top of Table II), and for some embodiments of the present invention (bottom of Table II). For example, in the prior art, the optimized modes A and D would alternate for the bulk milling process which creates the triangular trenches illustrated in FIGS. 11 and 12. For some embodiments of the present invention, the bulk milling process comprises the optimized bulk milling mode A alternating with the non-optimized coarse imaging mode B. As long as the spatial resolution for the non-optimized mode B is adequate to locate the fiducial marks 806 and 808 (see FIG. 9), then this embodiment of the present invention is superior to the prior art since the switching times for modes A↔B or A↔C will be shorter than the switching times for modes A↔D.

TABLE I

Focused Ion Beam (FIB) column operating modes for the prior art and an embodiment of the present invention.
FIB COLUMN OPERATING MODES

| Mode | Set-up? | Application |
| --- | --- | --- |
| A | Optimized | Bulk Milling |
| B | Non-optimized | Coarse Imaging |
| C | Non-optimized | Intermediate Imaging |
| D | Optimized | Fine Milling/Fine Imaging |
| E | Non-optimized | Fine Imaging |
| F | Optimized | Best Imaging |

TABLE II

Combinations of the operating modes in Table I for each of the three process steps (bulk milling, fine milling, polishing) in the prior art and for an embodiment of the present invention.

COMBINATIONS OF OPERATING MODES FOR THE PRIOR ART

| | Operating Mode | |
| --- | --- | --- |
| Process Step | Milling | Imaging |
| Bulk Milling | A | D |
| Fine Milling | D | F |
| Polishing | F | F |

COMBINATIONS OF OPERATING MODES FOR THE PRESENT INVENTION

| | Operating Mode | |
| --- | --- | --- |
| Mode | Milling | Imaging |
| Bulk Milling | A | B or C |
| Fine Milling | D | E |
| Polishing | F | F |

Figure 13:
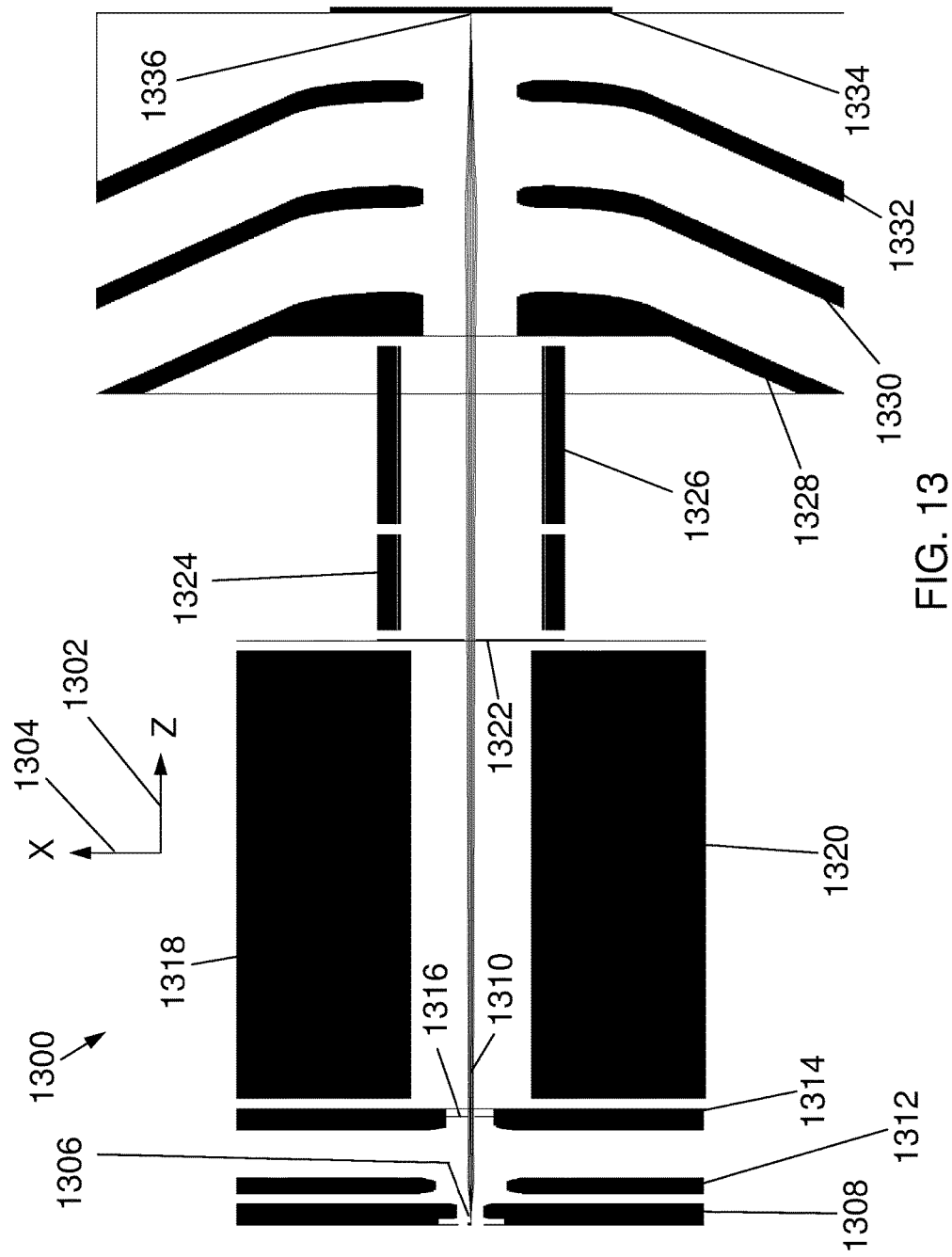
FIG. 13 is a side cross-sectional view of an exemplary FIB column capable of implementing the imaging and milling processes of an embodiment of the present invention.

Focused Ion Beam (FIB) Column Implementing an Embodiment of the Present Invention FIG. 13 is a side cross-sectional view of an exemplary FIB column 1300 capable of implementing the multi-step imaging and milling processes of an embodiment of the present invention. An X-Y-Z coordinate system is shown, wherein the X-axis 1304 is perpendicular to the Z-axis 1302 representing the optical axis of column 1300. A Y-axis (not shown) would be perpendicular to the plane of the figure. To induce ion emission, an "extraction" voltage is applied between the source 1306 and the extraction electrode 1308. This bias voltage may be typically −7000 to −15000 V if source 1306 is a liquid metal ion source (LMIS) emitting positive ions. The initial ion emission from source 1306 is generally into a cone with a half-angle of ~30° [i.e., a solid angle of $\pi$ $(\pi 30°/180°)^2 \approx 0.86$ steradians]. An ion "gun" comprises the source 1306, extractor 1308, gun focus electrode 1312, and gun exit electrode 1314. The beam-defining aperture (BDA) 1316 is also part of the gun, mounted within the gun exit electrode 1314. A focus voltage is applied to the gun focus electrode 1312, and the gun exit electrode 1314 is biased to ground potential (0 V)—thus, in this example, since the target is also biased to ground potential, ions leaving the gun are already at their final beam energy. Different voltages on the extractor 1308, focus electrode 1312 and exit electrode 1314 induce electric fields within the gun on and near to the column axis—these electric fields deflect and focus the ion beam 1310, as shown in the trajectory diagrams of FIGS. 14-17. In some cases, there is minimal focusing effect within the gun, especially for cases in which smaller beams are desired at the target and therefore higher source-to-target demagnifications are required. In other cases, the gun will form a generally parallel beam which is then focused onto the target by the main lens at a lower demagnification, producing a larger beam with higher current. Below the gun is a beam blanker, comprising electrodes 1318 and 1320. When the beam is on, electrodes 1318 and 1320 are both typically at 0 V, and thus the beam 1310 passes through the blanker and a beam-blanking aperture (BBA) 1322 undeflected. To turn the beam off, a positive voltage is applied to electrode 1318 and a negative voltage to electrode 1320, thereby causing the beam 1310 to be deflected off axis to strike the BBA 1322. Typical blanking voltages may be 5 to 10 V.

Below the BBA 1322 are the upper deflector 1324 and lower deflector 1326. Both these deflectors are typically either quadrupoles or octupoles (electrostatic and/or magnetic). In all cases, deflection requires a rotatable dipole field (i.e., deflecting in any direction within the X-Y off-axis plane)—higher-order electrode configurations such as octupoles are used to reduce deflection aberrations by producing more uniform fields, as is familiar to those skilled in the art. Deflectors 1324 and 1326 comprise a "double-deflector" which can control both the beam position and slope entering the main lens, thereby enabling the reduction of off-axis aberrations during imaging and milling. Electrodes 1328, 1330 and 1332 comprise the main lens, which focuses the beam 1310 onto the surface of target 1334 at a location 1336. In the example shown here, the voltages on electrodes 1328 and 1332 are the same, 0 V relative to ground. For focusing, the voltage on electrode 1330 will then differ from 0 V in order to generate the necessary focusing electric fields between electrodes 1328, 1330, and 1332. For positive ions, if the voltage on electrode 1330 is >0 V, the main lens is a "decelerating lens", if the voltage on electrode 1330 is <0 V, then the main lens is an "accelerating lens". Both main lens configurations are suitable for use with the multi-step imaging and milling process of some embodiments of the present invention.

Figure 14:
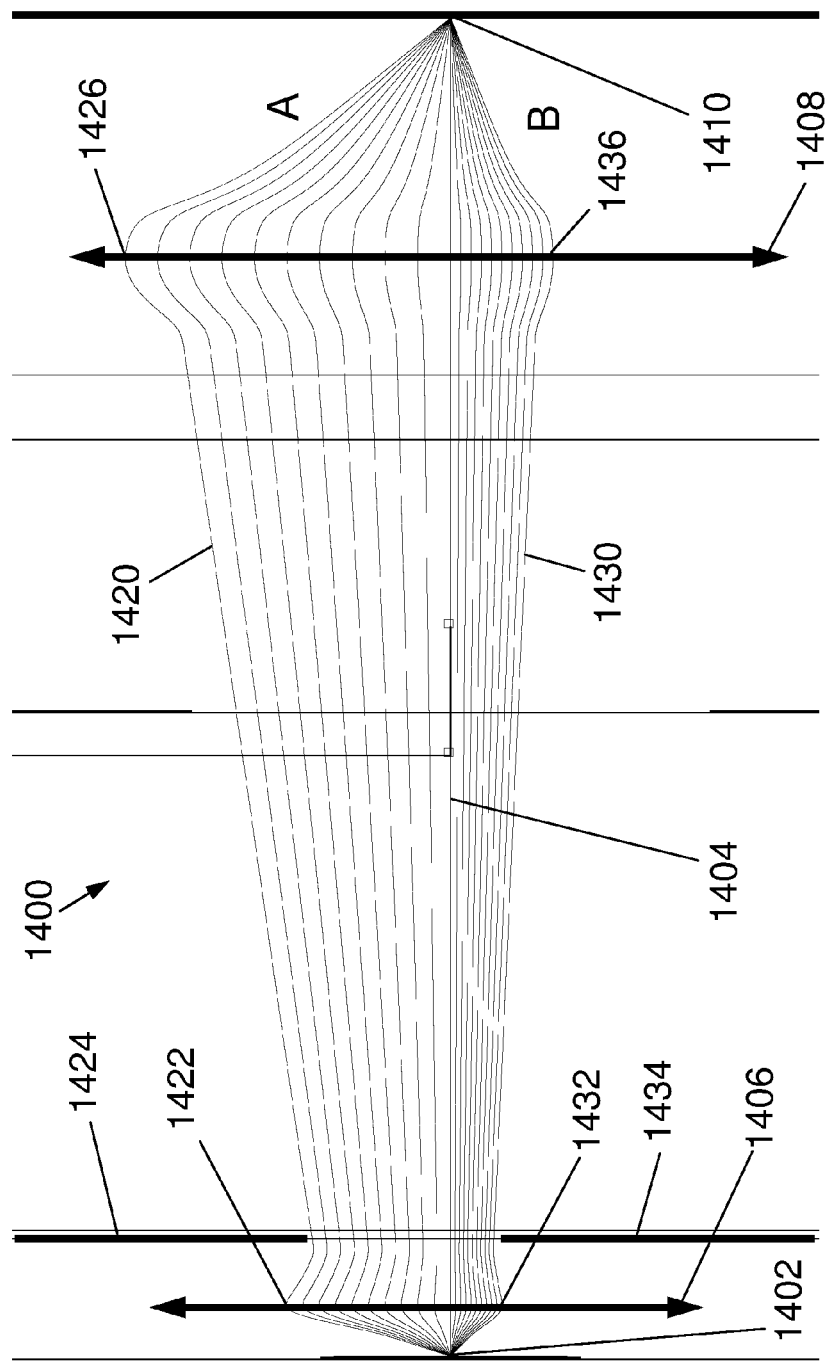
FIG. 14 is a side view of ion trajectories for a bulk milling process A and a coarse imaging process B of an embodiment of the present invention.
Figure 15:
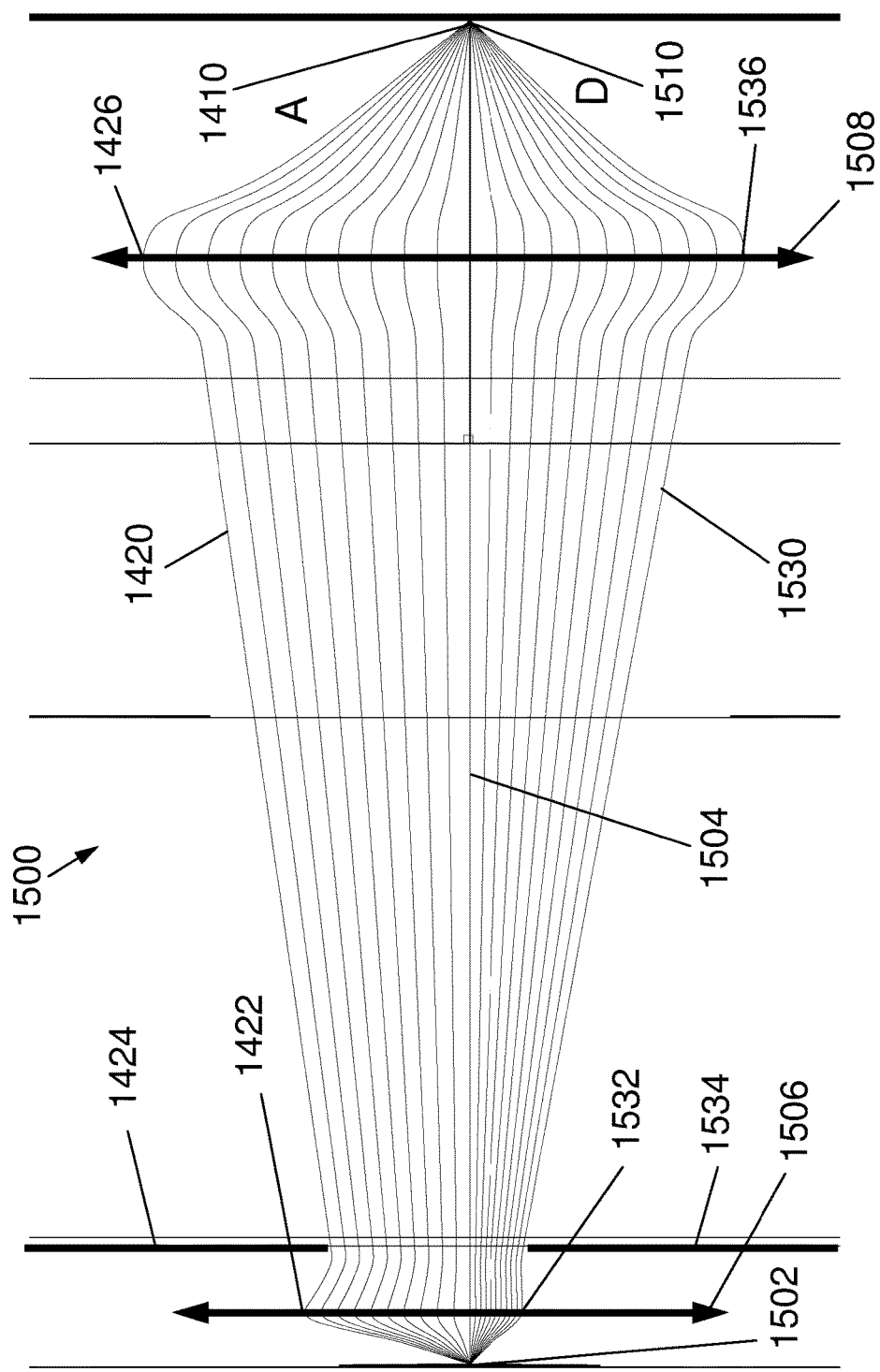
FIG. 15 is a side view of ion trajectories for a bulk milling process A and a fine imaging process D of the prior art.
Figure 16:
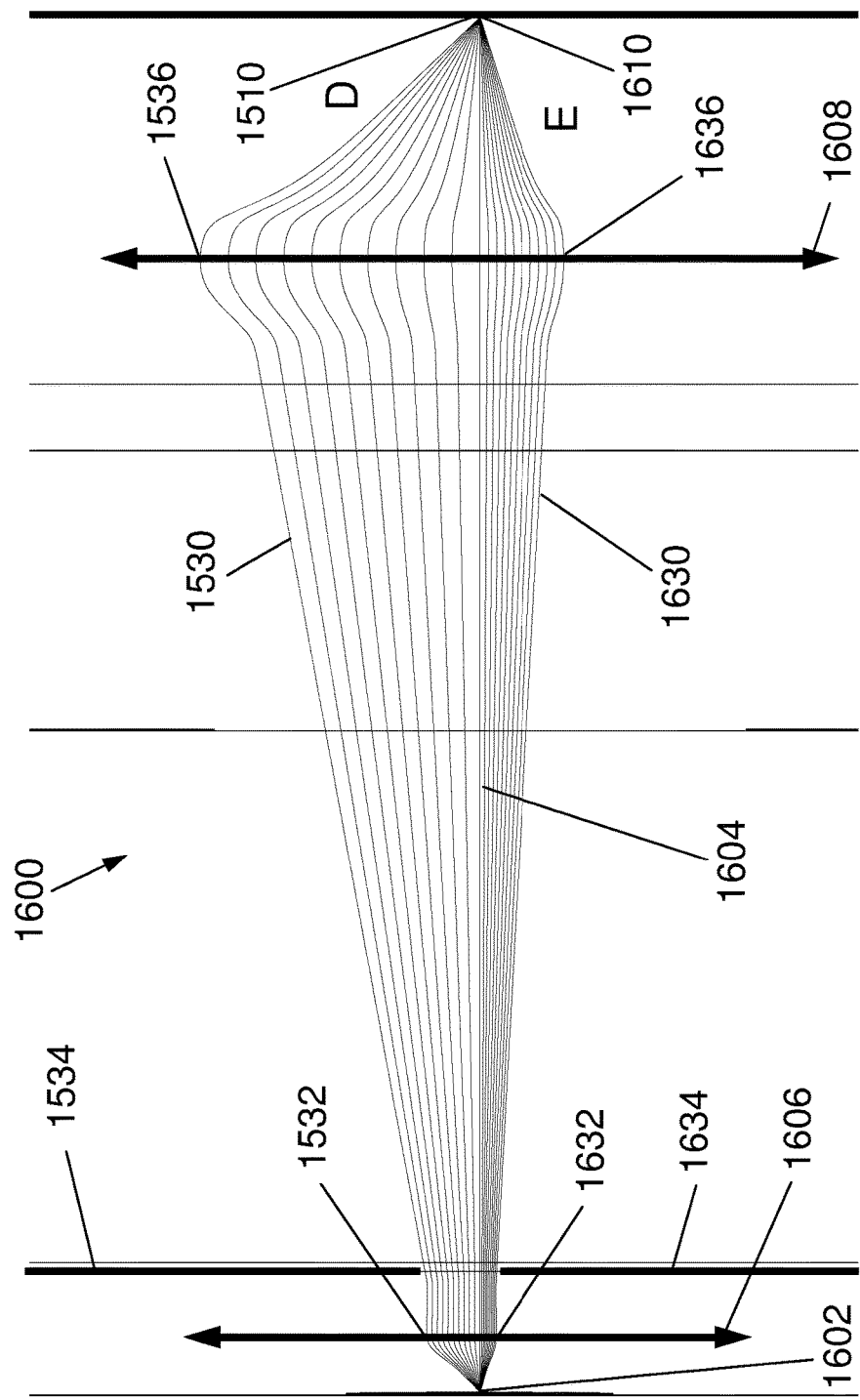
FIG. 16 is a side view of ion trajectories for a fine milling process D and a fine imaging process E of an embodiment of the present invention.
Figure 17:
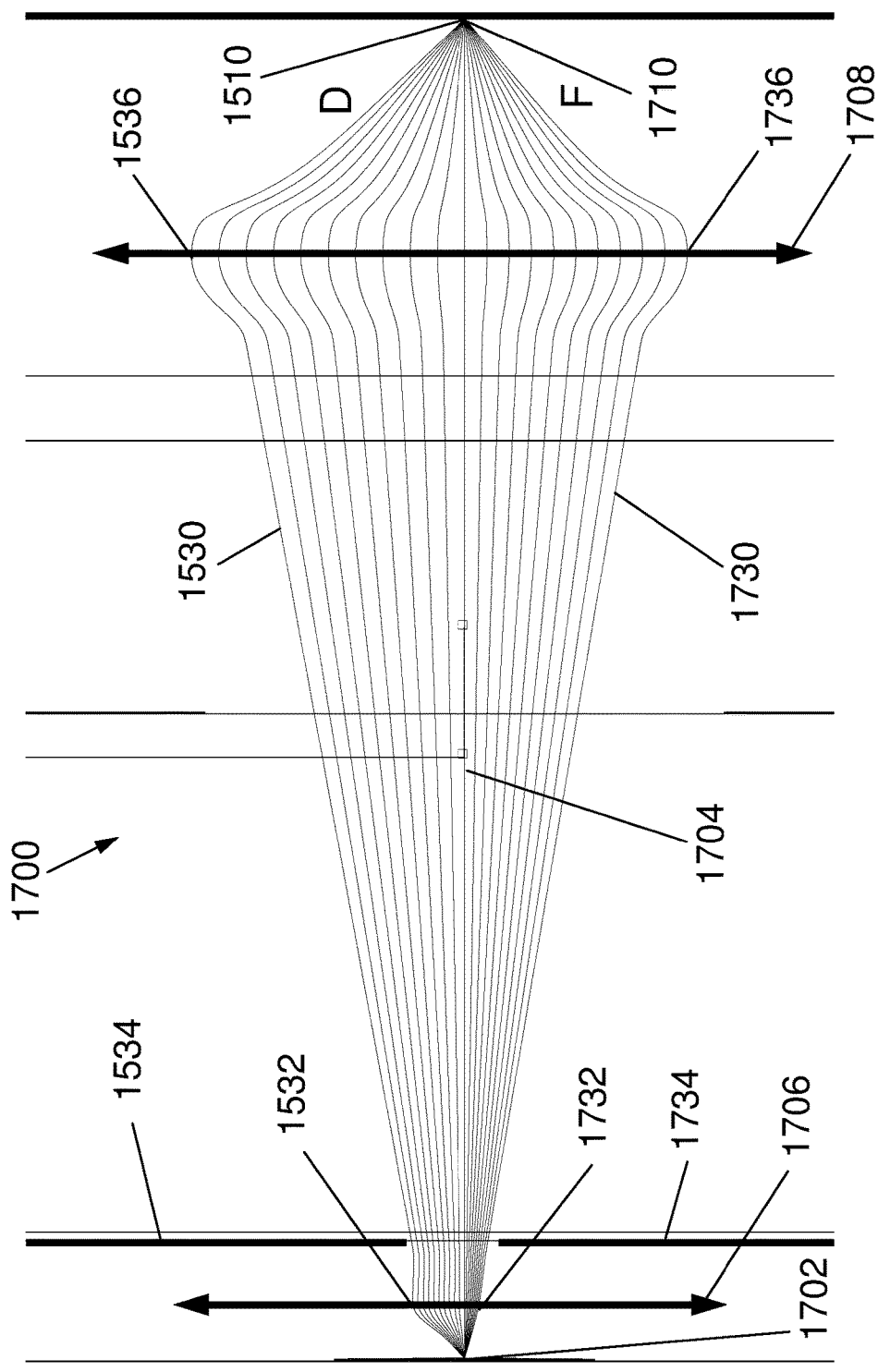
FIG. 17 is a side view of ion trajectories for a fine milling process D and a fine imaging process F of the prior art.

Focused Ion Beam Trajectories for Various Operating Modes of the Prior Art and an Embodiment of the Present Invention In this section, FIGS. 14-17 illustrate various focused ion beam trajectories, both for some embodiments of the present invention (FIGS. 14 and 16) and the prior art (FIGS. 15 and 17). These trajectories form the basis for understanding the operational differences between the FIB column set-ups in the prior art compared with some embodiments of the present invention—in particular, the origins of the different beam diameters (both full width half maximum "FWHM," and the diameter containing ½ of the beam current "d50") and the source-to-target demagnifications. It will be understood that the figures show different trajectories shown juxtaposed in the same figure for illustration and that in operation, each mode is symmetric around the optical axis. Moreover, the trajectory lines do not correspond to a specific number of charged particles, so more closely spaced lines do no indicate a higher current density.

FIG. 14 is a side view 1400 of ion trajectories 1420 for bulk milling mode A (above the optical axis 1404) and trajectories 1430 for coarse imaging mode B of an embodiment of the present invention. For both modes A and B, ions are emitted from a source 1402, corresponding to source 1306 in FIG. 13. These ions are then focused by gun lens 1406, corresponding to electrodes 1308, 1312 and 1314 in FIG. 13. Trajectories 1420 and 1430 are then imaged onto the target at a location 1410 by main lens 1408. In this configuration, the voltages on the gun lens and main lens electrodes are unchanged between modes A and B, and only the beam-defining apertures (BDAs) 1424 and 1434 differ between the higher current bulk milling mode A, and the lower current coarse imaging mode B. This can be seen by comparison of the radius of BDA 1424 (above axis 1404) for mode A with the radius of BDA 1434 (below axis 1404) for mode B—note that in both cases, the radii of BDAs 1424 and 1434 determine the maximum half-angles of emission from the source 1402 which pass to the target, forming the focused ion beams for modes A and at location 1410. The ratio of the maximum radii 1422 and 1432 of trajectories 1420 and 1430, respectively, at the gun lens is the same as the ratio of the maximum radii 1426 and 1436 at the main lens—this shows that all the off-axis radii of individual rays within trajectories 1420 and 1430 at every point along axis 1404 are proportional to each other with the same ratio, differing only in their overall scaling along the X- and/or Y-axes. The reason for this proportionality between trajectories 1420 and 1430 is that for some embodiments of the present invention, the only difference in the column configuration between the bulk milling mode A and coarse imaging mode B is the selection of the BDA—none of the lens voltage settings is changed, and thus the overall focusing characteristics of the columns for modes A and B are the same. An alternative implementation may utilize mode C to provide intermediate imaging, instead of mode B for coarse imaging. The benefit of using modes A and B is less sensitivity to BDA misalignment (because BDA 1434 has a radius closer to the radius of BDA 1424 than the BDA radius used for mode C), while the benefit of using modes A and C is that intermediate imaging mode C has a lower beam current than coarse imaging mode B, and thus thinner depositions 708 (see FIG. 7) and shallower fiducial marks 806 and 808 (see FIG. 8) are allowed, saving in deposition and milling times and enabling higher lamella preparation throughputs.

FIG. 15 is a side view 1500 of ion trajectories 1420 (above the optical axis 1504) for the same bulk milling mode A as in FIG. 14, and trajectories 1530 for fine imaging mode D of the prior art. For both modes A and D, ions are emitted from a source 1502, corresponding to source 1306 in FIG. 13. These ions are then focused by gun lens 1506, corresponding to electrodes 1308, 1312 and 1314 in FIG. 13. Trajectories 1420 are imaged onto the target at a location 1410 by main lens 1508, as in FIG. 14. Trajectories 1530 are imaged onto the target at a location 1510, which may be the same as, or in the vicinity of, location 1410, also by main lens 1508. In this prior art configuration, the voltages on the gun lens and main lens electrodes and the beam-defining apertures (BDAs) may all be changed between modes A and D. This can be seen by comparison of the radius of BDA 1424 (above axis 1504) for mode A with the radius of the BDA 1534 (below axis 1504) for mode D—note that in both cases, the radii of the BDAs 1424 and 1534 determine the maximum half-angles of emission from the source 1502 which pass to the target, forming the focused ion beams at locations 1410 and 1510, respectively. The ratio of the maximum radii 1422 and 1532 of trajectories 1420 and 1530, respectively, at the gun lens differs from the ratio of the maximum radii 1426 and 1536 at the main lens—this shows that the two modes A and D correspond to different source-to-target magnifications, stemming from different voltage settings on the gun and main lens electrodes, as shown in Table III. The reason for these voltage and BDA changes is that in the prior art, efforts were made to optimize the optical set-ups for both the bulk milling mode A and the fine imaging mode D. Table III shows a comparison of the prior art (FIG. 15) with an embodiment of the present invention (FIG. 14) with respect to various operating parameters for modes A to D.

FIG. 16 is a side view 1600 of ion trajectories 1530 for fine milling mode D (above the optical axis 1604) and trajectories 1630 for fine imaging mode E of an embodiment of the present invention. For both modes D and E, ions are emitted from a source 1602, which may correspond to source 1402 in FIG. 14. These ions are then focused by gun lens 1606, which may correspond to gun lens 1406 in FIG. 6. Trajectories 1530 and 1630 are then imaged onto the target at locations 1510 and 1610, respectively, by main lens 1608, which may correspond to main lens 1408 in FIG. 14. In this configuration, the voltages on the gun lens and main lens electrodes are unchanged between modes D and E, and only the beam-defining apertures (BDAs) differ between the higher current fine milling mode D, and the lower current fine imaging mode E. This can be seen by comparison of the radius of BDA 1534 (above axis 1604) for mode D with the radius of BDA 1634 (below axis 1604) for mode E—note that in both cases, the radii of the BDAs 1534 and 1634 determine the maximum half-angles of emission from the source 1602 which pass to the target, forming the focused ion beams at locations 1510 and 1610. The ratio of the maximum radii 1532 and 1632 of trajectories 1530 and 1630, respectively, at the gun lens is the same as the ratio of the maximum radii 1536 and 1636 at the main lens—this shows that all the off-axis radii of individual rays within trajectories 1530 and 1630 at every point along axis 1604 are proportional to each other with the same ratio, differing only in their overall scaling along the X- and Y-axes. The reason for this proportionality between trajectories 1530 and 1630 is that for this embodiment of the present invention, the only difference in the column configuration between the fine milling mode D and fine imaging mode E is the selection of the BDA—none of the lens voltage settings is changed, and thus the overall focusing characteristics of the columns for modes D and E are the same. Note that the trajectories for modes D and E, differ qualitatively from the trajectories for modes A and B, however—this arises from the different settings of the gun and main lens focusing voltages for the two pairs of operating modes, as shown in Table III. In modes A and B, the source-to-target demagnification is less since a larger beam with more current is desired. For modes D and E, however, smaller beams with less current are required. Comparative magnifications and BDA diameters are shown in Table III.

FIG. 17 is a side view 1700 of ion trajectories 1530 (above the optical axis 1704) for the same fine milling mode D as in FIG. 16, and trajectories 1730 for a best imaging mode F of the prior art. For both modes D and F, ions are emitted from a source 1702, corresponding to source 1306 in FIG. 13. These ions are then focused by gun lens 1706, corresponding to electrodes 1308, 1312 and 1314 in FIG. 13. Trajectories 1530 are imaged onto the target at a location 1510 by main lens 1708, exactly as in FIGS. 15 and 16. Trajectories 1730 are imaged onto the target at a location 1710, which may be the same as, or in the vicinity of, location 1510, also by main lens 1708. In this prior art configuration, the voltages on the gun lens and main lens electrodes and the beam-defining apertures (BDAs) may all be changed between modes D and F. This can be seen by comparison of the radius of BDA 1534 (above axis 1704) for mode D with the radius of BDA 1734 (below axis 1704) for mode F—note that in both cases, the radii of the BDAs 1534 and 1734 determine the maximum half-angles of emission from the source 1702 which pass to the target, forming the focused ion beams at locations 1510 and 1710, respectively. The ratio of the maximum radii 1532 and 1732 of trajectories 1530 and 1730, respectively, at the gun lens differs from the ratio of the maximum radii 1536 and 1736 at the main lens—this shows that the two modes D and F correspond to different source-to-target magnifications, stemming from different voltage settings on the gun and main lens electrodes, as shown in Table III. The reason for these voltage and BDA changes is that in the prior art, efforts were made to optimize the optical set-ups for both the fine milling mode D and the fine imaging mode F. Table III shows a comparison of the prior art (FIG. 17) with an embodiment of the present invention (FIG. 16) with respect to various operating parameters for modes D, E and F.

Comparison of Operating Parameters and Beam Characteristics for Six Operating Modes of an Embodiment of the Present Invention and the Prior Art In this section, FIGS. 18-25 illustrate various system operating parameters for the six modes A-F summarized in Table I, with operating parameters detailed in Table III. Table II summarizes the combinations of modes used in both the prior art and an embodiment of the present invention. Modes A and B alternate as shown in FIG. 14 for a bulk milling and coarse imaging process in some embodiments of the present invention. Alternatively, modes A and C may be used in some embodiments of the present invention for bulk milling with improved imaging. Modes A and D alternate (FIG. 15) in the prior art for a bulk milling process, but with longer switching times between the milling (mode A) and imaging (mode D) modes due to the need for more parameter changes (electrode voltages) between modes. For fine milling and fine imaging, modes D and E alternate in an embodiment of the present invention, as shown in FIG. 16. Modes D and F alternate (FIG. 17) in the prior art for a fine milling process and best imaging process, again with longer switching times. In all of FIGS. 18-25, points on the graphs are labeled with the modes A-F.

TABLE III

FIB Column operating parameters for modes A-F. Voltages are provided both referenced to the tip and also to ground potential.

| | | Operating Mode | | | | | |
|---|---|---|---|---|---|---|---|
| | | A | B | C | D | E | F |
| | | Voltages relative to tip | | | | | |
| Beam Current | (pA) | 13780.6 | 1345.76 | 121.118 | 1345.76 | 121.118 | 121.118 |
| FWHM Beam Diameter | (nm) | 75 | 65 | 60 | 30 | 29 | 12 |
| d50 | (nm) | 105 | 66 | 60 | 44 | 25 | 25 |

TABLE III-continued

FIB Column operating parameters for modes A-F. Voltages are provided
both referenced to the tip and also to ground potential.

|  |  | Operating Mode | | | | | |
| --- | --- | --- | --- | --- | --- | --- | --- |
|  |  | A | B | C | D | E | F |
| Magnification |  | 1.40 | 1.40 | 1.40 | 0.52 | 0.52 | 0.19 |
| Beam-Limiting Aperture Dia. | (μm) | 118 | 36 | 11 | 45 | 14 | 20 |
| Extraction Voltage | (V) | 9500 | 9500 | 9500 | 9500 | 9500 | 9500 |
| Gun Lens Voltage | (V) | 2280 | 2280 | 2280 | 3335 | 3335 | 10500 |
| Beam Energy within Column | (eV) | 30000 | 30000 | 30000 | 30000 | 30000 | 30000 |
| Main Lens Voltage | (V) | 9810 | 9810 | 9810 | 9460 | 9460 | 9327 |
| Beam Energy at Target | (eV) | 30000 | 30000 | 30000 | 30000 | 30000 | 30000 |
|  |  | Voltages relative to ground: | | | | | |
| Tip Bias Voltage | (V) | 30000 | 30000 | 30000 | 30000 | 30000 | 30000 |
| Extraction Voltage | (V) | 20500 | 20500 | 20500 | 20500 | 20500 | 20500 |
| Gun Lens Voltage | (V) | 27720 | 27720 | 27720 | 26665 | 26665 | 19500 |
| Column Voltage | (V) | 0 | 0 | 0 | 0 | 0 | 0 |
| Main Lens Voltage | (V) | 20191 | 20191 | 20191 | 20540 | 20540 | 20674 |
| Target Voltage | (V) | 0 | 0 | 0 | 0 | 0 | 0 |

Figure 18:
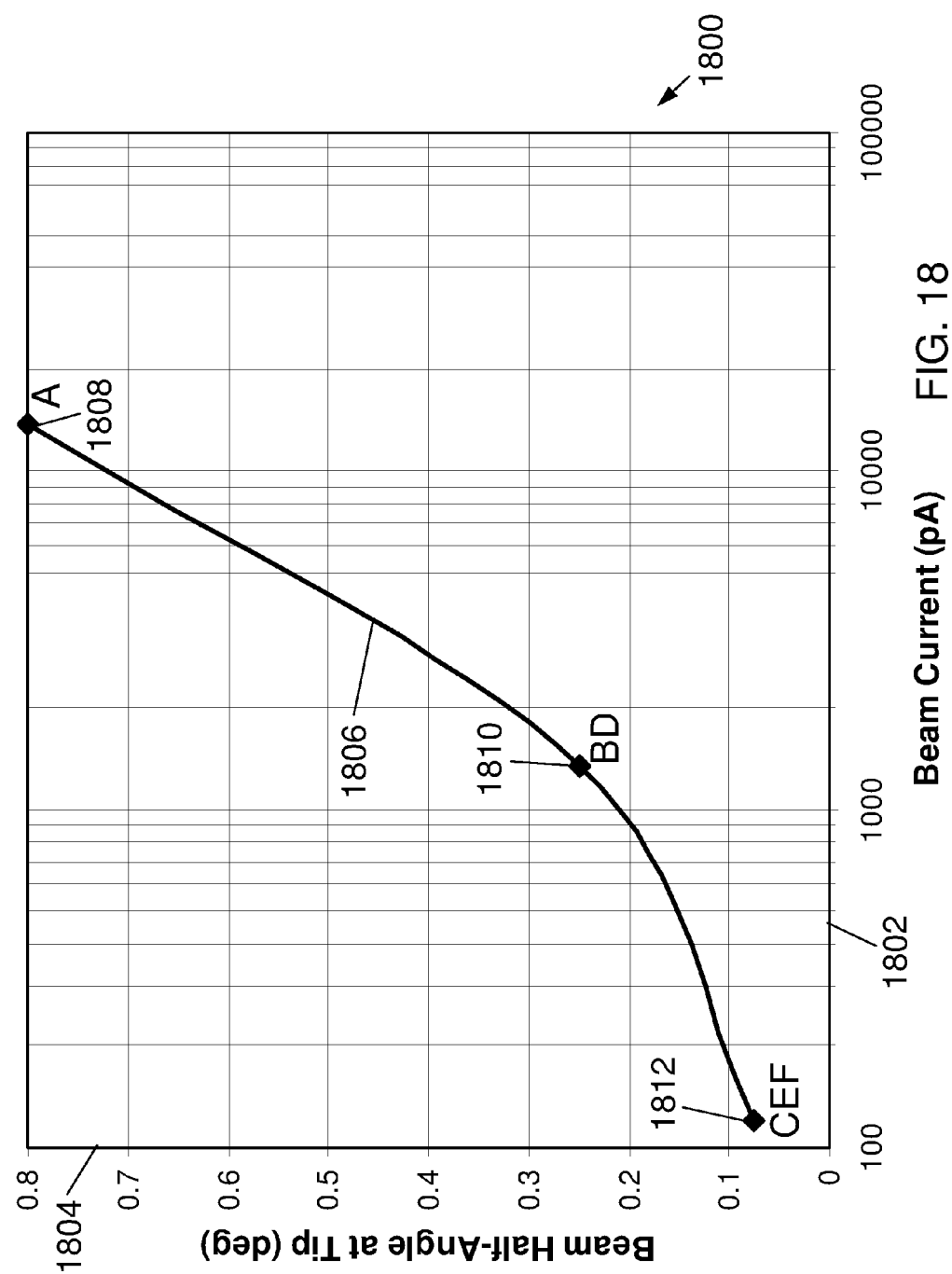
FIG. 18 is a graph of the beam half-angle at the emitter tip as a function of the beam current for six operating modes A-F.

FIG. 18 is a graph 1800 of the beam half-angle 1804 at the emitter tip as a function of the beam current 1802 for the six operating modes A-F. Mode A has the most beam current (13.7 nA—see Table III) in order to maximize the bulk milling rate—for an assumed source angular intensity of 22.5 μA/sr this requires a beam half-angle at the tip of 0.8°:

$$\begin{aligned}
\text{Beam current} &= (\text{Angular Intensity}) \\
&\quad (\text{Solid angle of emission through } BDA) \\
&= (22.5\ \mu\text{A/sr})[\pi(\pi 0.8°/180°)]^2 \\
&= (22.5\ \mu\text{A/sr})[\pi(0.014\ \text{rad})]^2 \\
&= (22.5\ \mu\text{A/sr})(0.000612\ \text{sr}) \\
&= 0.0137\ \mu\text{A} \\
&= 13.7\ \text{nA}
\end{aligned}$$

Modes B and D have the same beam half-angle at the tip (0.25°) (although not the same BDA diameter—see FIG. 19) and thus have the same beam current, 1.34 nA, calculated as shown above. Modes C, E and F, also share the same beam half-angle (0.075°) (but not the same BDA diameter—see FIG. 19), and thus have the same beam current, 121 pA. Note that the beam currents for mode A, modes B and D, and modes C, E and F, have been set to have roughly factor of ten differences by the proper choices of BDA diameters (diameter ratios roughly $1/\sqrt{10}$)—see Table III.

Figure 19:
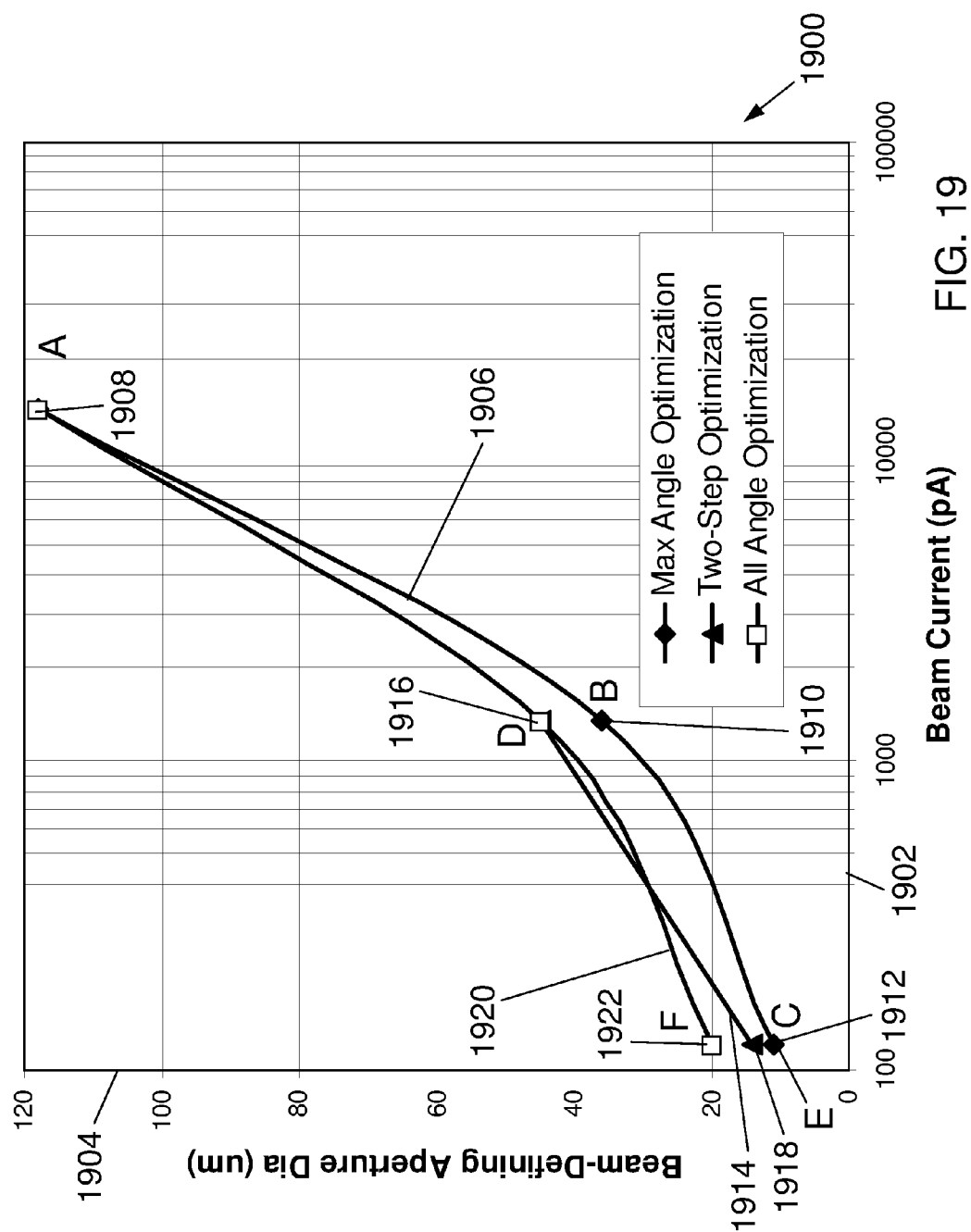
FIG. 19 is a graph of the beam-defining aperture (BDA) diameter as a function of the beam current for six operating modes A-F.

FIG. 19 is a graph 1900 of the beam-defining aperture (BDA) diameter 1904 as a function of the beam current 1902 for the six operating modes A-F. Note that although modes B and D correspond to the same half-angle of emission at the source tip (thereby giving the same beam currents), modes B and D require different BDA diameters—this is because modes B and D have differing lens settings (see Table III) and thus different correlations between half-angle at the tip and the beam diameter at the exit of the gun where the BDA is located. To see how this occurs, compare trajectories 1430 (mode B) in FIGS. 14 and 1530 (mode D) in FIG. 15—clearly trajectories 1430 are more parallel between gun lens 1406 and main lens 1408 than are trajectories 1530 between gun lens 1506 and main lens 1508. This corresponds to mode B having a lower source-to-target demagnification than does mode D—in general, increased demagnification enables smaller beam diameters and lower beam currents. From graph 1900 it can be seen that for an embodiment of the present invention, two BDAs are needed to implement bulk milling and imaging (modes A and B—see Table II), and a second pair of BDAs are needed for fine milling and imaging (modes D and E—see Table II). In the prior art, only three BDAs are required: two to implement bulk milling and imaging (modes A and D—see Table II), and one additional BDA for fine milling and imaging since mode D is in common between the two milling processes (modes D and F—see Table II).

Figure 20:
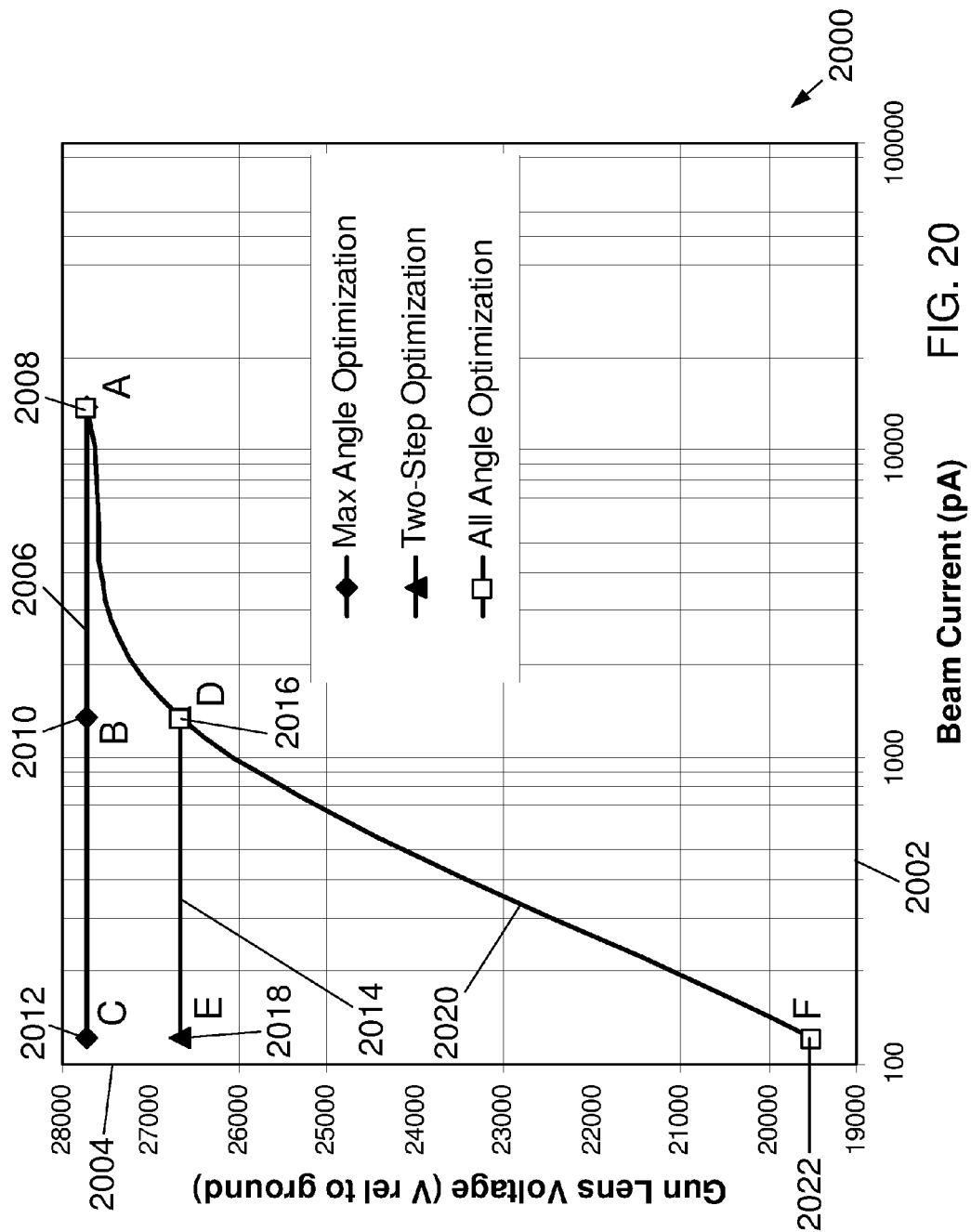
FIG. 20 is a graph of the gun lens focusing voltage as a function of the beam current for six operating modes A-F.

FIG. 20 is a graph 2000 of the gun lens focusing voltage 2004 as a function of the beam current 2002 for the six operating modes A-F. For the invention, modes A, B and C all share the same gun focus voltage values 2008, 2010, and 2012, respectively, along curve 2006 since some embodiments of the present invention keep all FIB column voltage settings unchanged during the bulk milling process (using modes A↔B or A↔C). Similarly, for the invention, modes D and E share the same gun focus voltage values 2016 and 2018 along curve 2014 during the fine milling process step (using modes D↔E). Curve 2020 corresponds to the prior art, wherein modes A and D are used for the bulk milling process, and modes D and F are used for the fine milling process.

Figure 21:
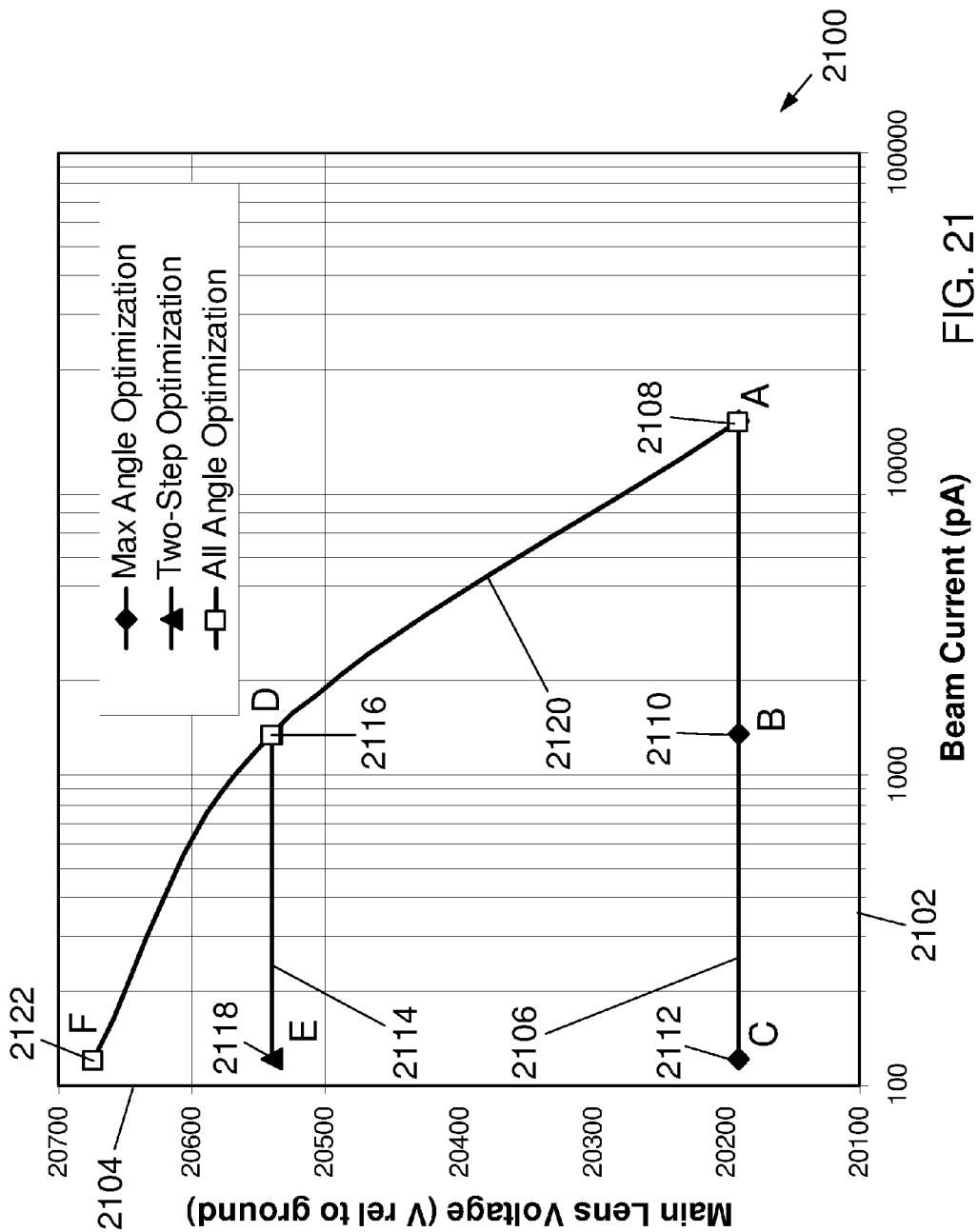
FIG. 21 is a graph of the main lens focusing voltage as a function of the beam current for six operating modes A-F.

FIG. 21 is a graph 2100 of the main lens focusing voltage 2104 as a function of the beam current 2102 for the six operating modes A-F. For the invention, modes A, B and C all share the same main lens focus voltage values 2108, 2110, and 2112, respectively, along curve 2106 since this embodiment of the present invention keeps all FIB column voltage settings unchanged during the bulk milling process step (using modes A↔B or A↔C). Similarly, for the invention, modes D and E share the same main lens focus voltage values 2116 and 2118 along curve 2114 during the fine milling process step (using modes D↔E). Curve 2120 corresponds to the prior art, wherein modes A and D are used for the bulk milling process, and modes D and F are used for the fine milling process.

Figure 22:
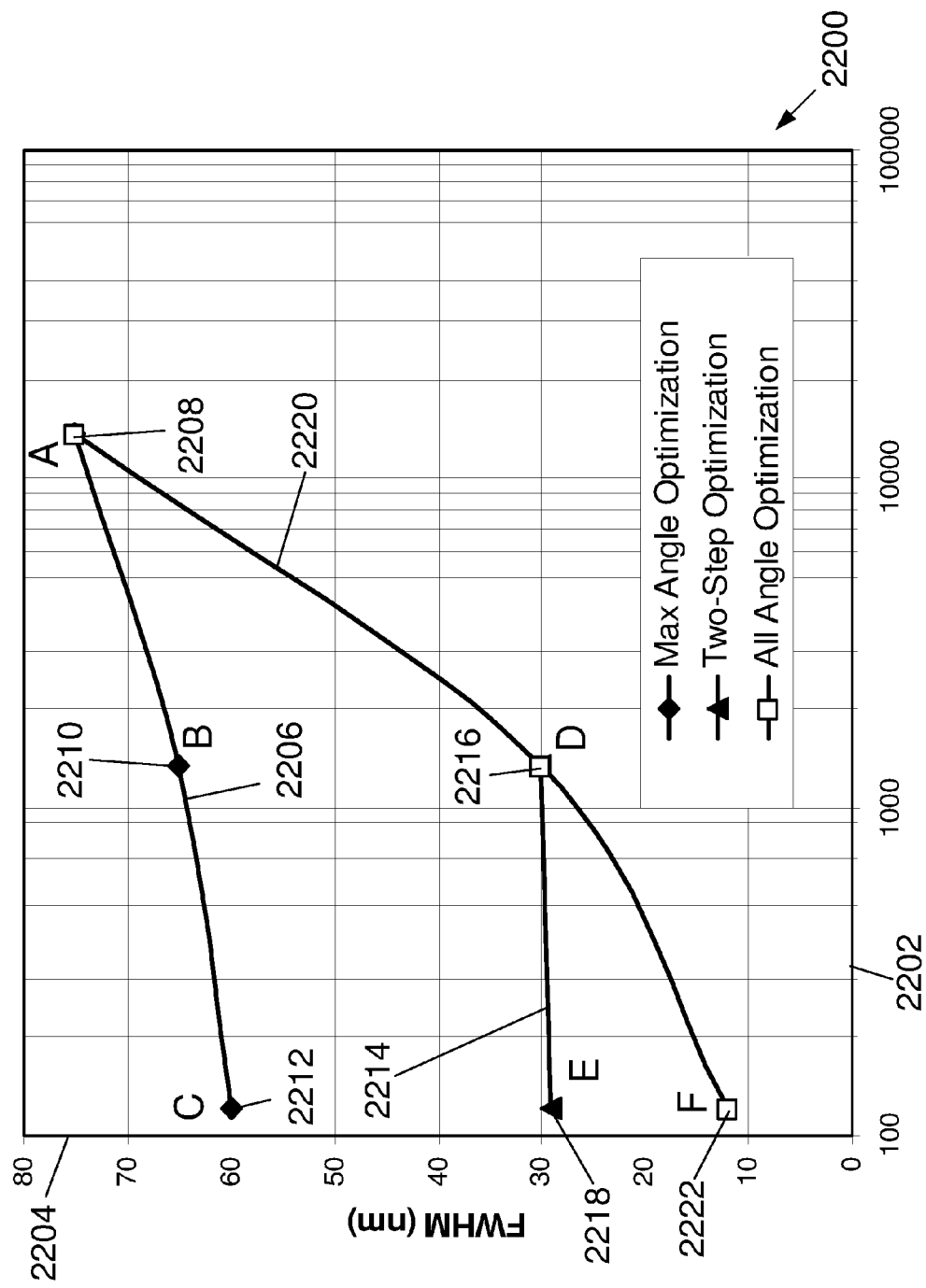
FIG. 22 is a graph of the full-width half-maximum (FWHM) beam diameter as a function of the beam current for six operating modes A-F.

FIG. 22 is a graph 2200 of the full-width half-maximum (FWHM) beam diameter 2204 as a function of the beam current 2202 for the six operating modes A-F. Curve 2206 for this embodiment of the present invention connects the FWHM beam diameters for mode A 2208, mode B 2210, and mode C 2212—note that as the beam current 2202 is reduced from mode A to mode B that the FWHM beam diameter is reduced from 75 nm to 65 nm, and then down to 60 nm for mode C. For the prior art, curve 2220 connects the FWHM beam diameters for mode A 2208, mode D 2216 and mode F 2222. A disadvantage of this embodiment of the present invention over the prior art can be seen here—the FWHM beam diameter 2210 for mode B is more than double the FWHM beam diameter 2216 for mode D. This disadvantage must be balanced against the benefits of this embodiment of the present invention over the prior art—more rapid switching between FIB bulk milling (mode A) and coarse imaging (mode B) using only mechanical changes in the BDA diameter, compared with the prior art requiring switching of FIB column voltages (with inherent settling times) as well as BDA mechanical changes. A decision on the applicability of an embodiment of the present invention over the prior art rests on whether the poorer imaging resolution in mode B compared with mode D does not appreciably affect the placement accuracy of the FIB milling beam for mode A. Similarly for the fine milling process comprising modes D and E in this embodiment of the present invention, compared with modes D and F in the prior art, the increased FWHM beam diameter for mode E relative to mode F is more than a factor of two. If a 29 nm FWHM beam diameter is acceptable for achieving accurate fine milling in mode D, then the smaller FWHM beam diameter for mode F is unnecessary. The relative time benefits of mode E over mode F are similar to those between modes B and D. Mode C is illustrated in the event that the bulk milling process is implemented using mode A for FIB milling, and mode C for intermediate imaging, as discussed above in FIG. 14.

Figure 23:
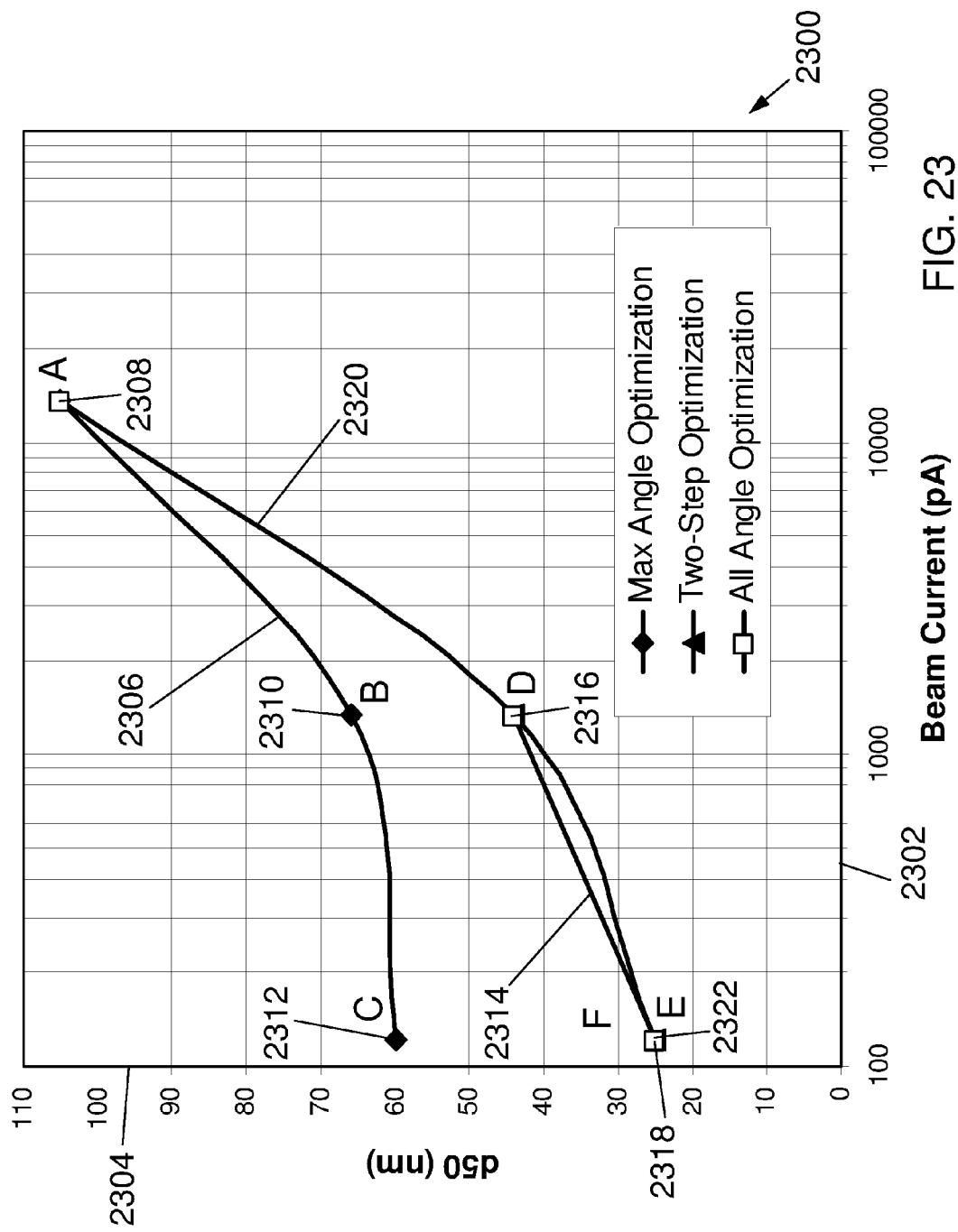
FIG. 23 is a graph of the beam diameter containing 50% of the total beam current (d50) as a function of the beam current for six operating modes A-F.

FIG. 23 is a graph 2300 of the beam diameter (d50) 2304 as a function of the beam current 2302 for the six operating modes A-F. Comparison of curve 2306 connecting modes A 2308, B 2310, and C 2312 shows that for the d50 beam diameters, there is a substantially larger improvement in resolution going from mode A to modes B and C than was the case in FIG. 22 using the FWHM to characterize the beam diameter. The reason for this difference is that the d50 diameter takes into account the larger beam "tails" occurring for larger beam diameters such as in mode A—thus for lower beam currents as in modes B and C, these tails drop more quickly than the diameter of the central beam reflected in the FWHM diameter. Comparison of the d50 values for mode B (65 nm) to the d50 value for mode D (44 nm) shows only about a 30% improvement, compared with over 50% for the FWHM values in FIG. 22. Curve 2314 connects modes D 2316 and mode E 2318 for this embodiment of the present invention. Mode F 2322 has the same value for d50 as mode E 2318, thus for the fine milling process in this embodiment of the present invention (D↔E) and the fine milling process in the prior art (D↔F) there will be no difference in the d50 beam diameters (although FIG. 22 shows a substantial difference in FWHM diameters between modes E and F). The effects of the beam tails during imaging are largely to reduce the achievable image contrast, while the FWHM beam diameter is a measure of the central beam. If lower contrast is acceptable, then mode E (with faster milling↔imaging switching times) may be preferred over the higher contrast but slower prior art fine milling process. Conversely, if the highest image contrasts are needed to accurately image the fiducial marks (such as 806 and 808 in FIG. 8), then the prior art fine milling process may be required, in spite of its throughput disadvantages.

Figure 24:
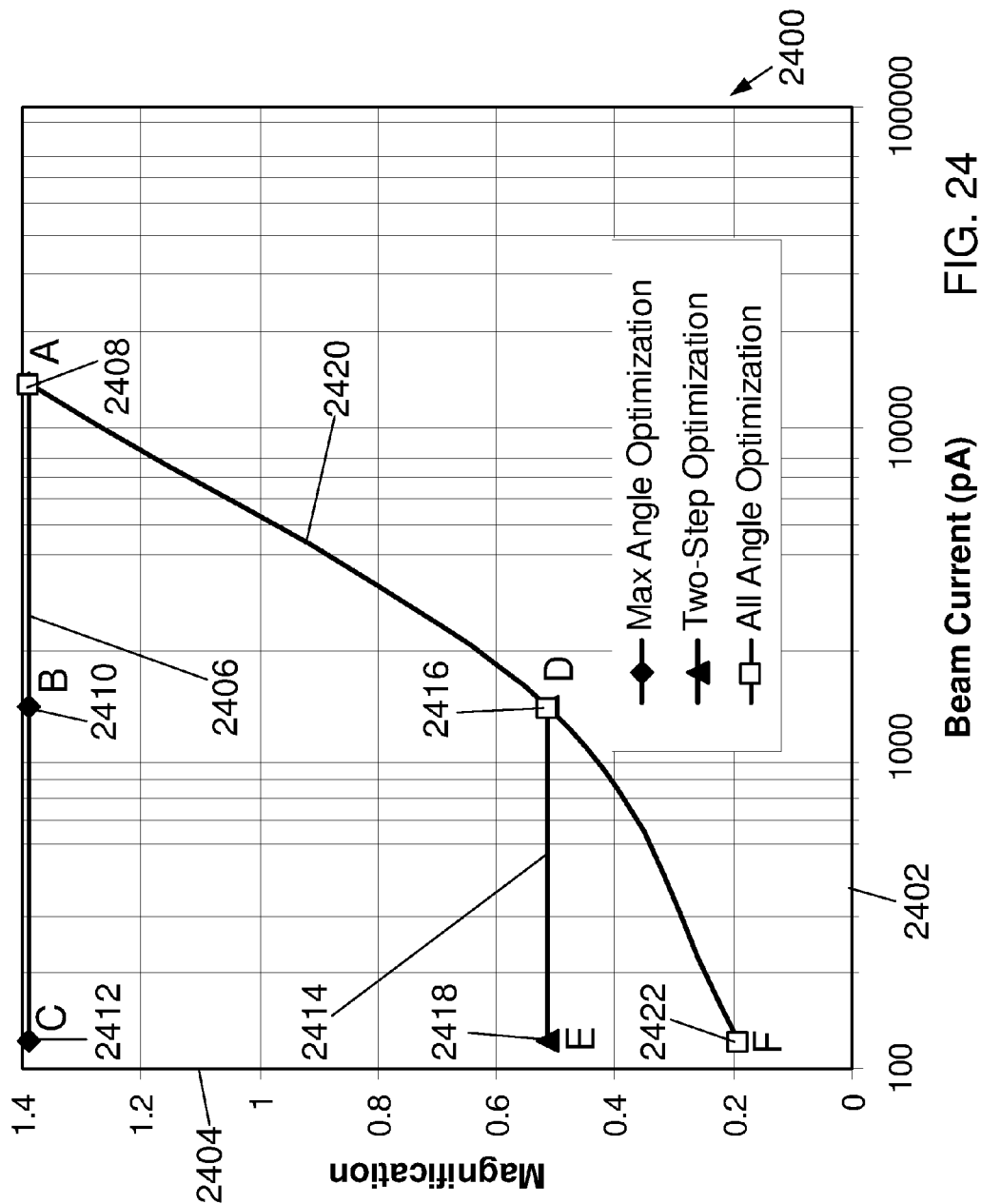
FIG. 24 is a graph of the source-to-target magnification as a function of the beam current for six operating modes A-F.

FIG. 24 is a graph 2400 of the source-to-target magnification 2404 as a function of the beam current 2402 for the six operating modes A-F. Modes A, B and C all share the same magnification values 2408, 2410, and 2412, respectively, along curve 2406 since this embodiment of the present invention keeps all FIB column voltage settings unchanged during the bulk milling process step (using modes A↔B or A↔C) and the lens voltages determine the magnification. Similarly, modes D and E also share the same magnification values 2416 and 2418 along curve 2414 during the fine milling process step (using modes D↔E). Curve 2420 corresponds to the prior art, wherein modes A and D are used for the bulk milling process, and modes D and F are used for the fine milling process.

Figure 25:
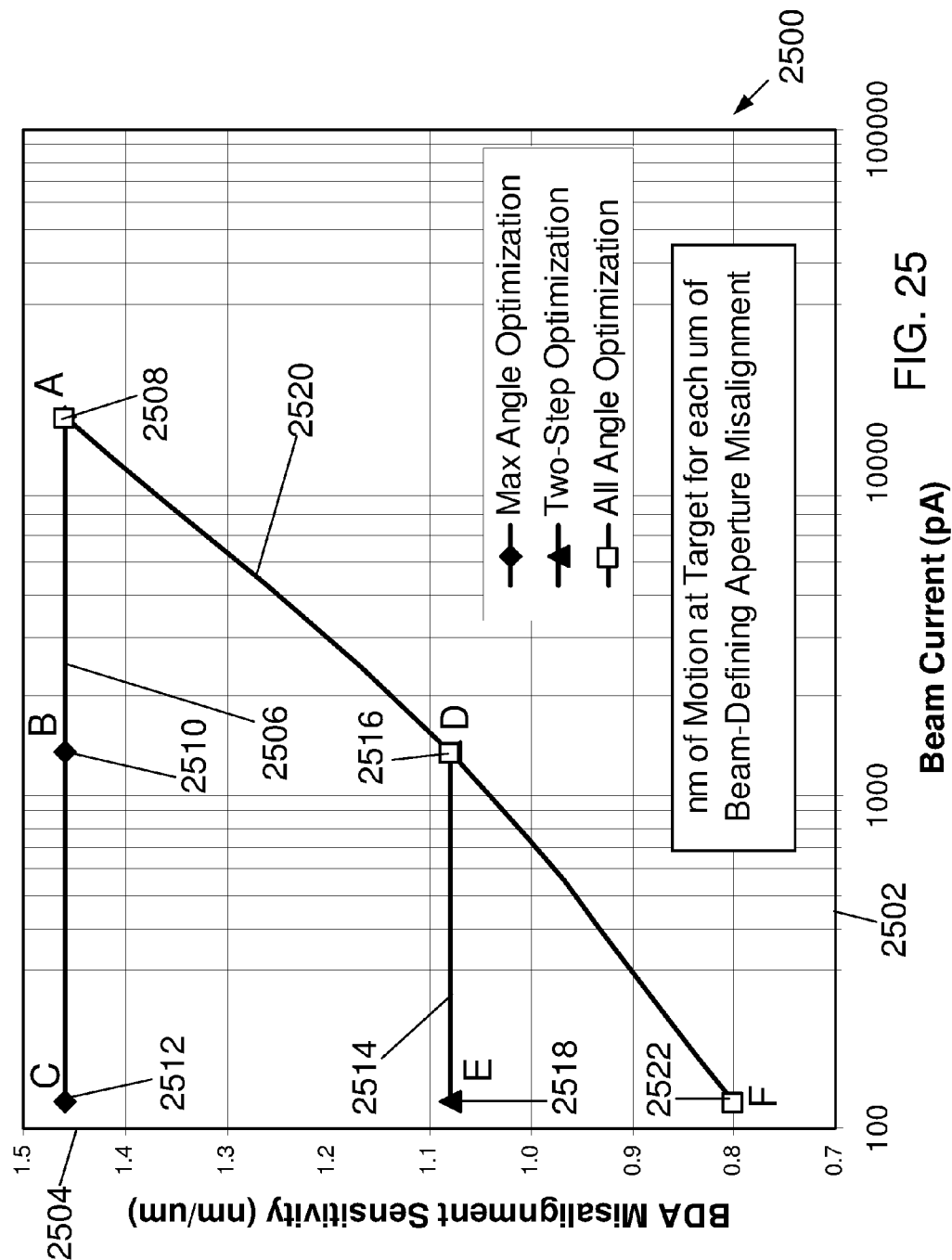
FIG. 25 is a graph of the beam-defining aperture (BDA) misalignment sensitivity as a function of the beam current for six operating modes A-F.

FIG. 25 is a graph 2500 of the beam-defining aperture (BDA) misalignment sensitivity 2504 as a function of the beam current 2502 for the six operating modes A-F. The BDA misalignment sensitivity corresponds to the amount of beam motion or displacement at the target (in nm) for each μm of BDA misalignment relative to the optical axis of the FIB column. Modes A, B and C all share the same misalignment sensitivity values 2508, 2510, and 2512, respectively, along curve 2506 since this embodiment of the present invention keeps all FIB column voltage settings unchanged during the bulk milling process step (using modes A↔B or A↔C) and the lens voltages determine the BDA misalignment sensitivity. Similarly, modes D and E also share the same BDA misalignment sensitivity values 2516 and 2518 along curve 2514 during the fine milling process step (using modes D↔E). Curve 2520 corresponds to the prior art, wherein modes A and D are used for the bulk milling process, and modes D and F are used for the fine milling process. Graph 2500 shows another disadvantage of this embodiment of the present invention over the prior art—the BDA mechanical motion must be about 30% more precise since the BDA misalignment sensitivities are greater—this is due to the higher source-to-target magnifications (lower demagnifications) illustrated in graph 2400 of FIG. 24, since the BDA misalignment sensitivity closely tracks the magnification, as shown by the highly similar curve shapes in graphs 2400 and 2500.

Figure 26:
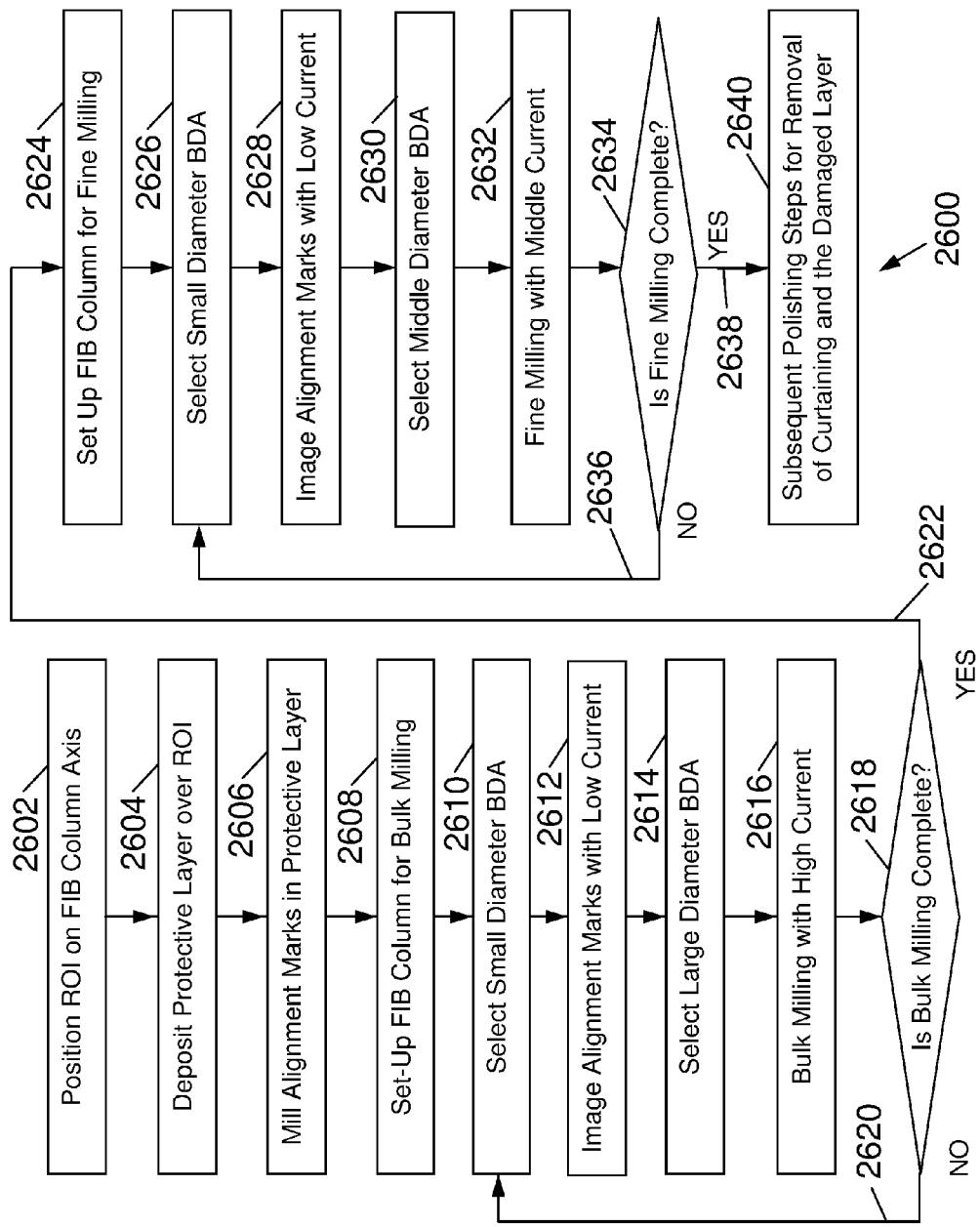
FIG. 26 is a flow chart for a two-step imaging and milling process of an embodiment of the present invention.

Process Flowchart for a Two-Step Milling Process of an Embodiment of the Present Invention FIG. 26 is a flow chart for a two-step imaging and milling process applicable to an embodiment of the present invention. The first step comprises a sequence of alternating coarse imaging and bulk milling modes constituting a bulk milling process. This is then followed by a second step comprising a sequence of alternating fine imaging and fine milling modes constituting a fine milling process. After completion of these two processes of this embodiment of the present invention, subsequent polishing steps may be used for final removal of curtaining and the layers damaged during the imaging and milling modes just completed.

First, in block 2602, the Region of Interest (RoI) is mechanically positioned on the axis of the focused ion beam (FIB) column by the stage—this may represent application of the process 2700 outlined in FIG. 27. In some cases, for example, the RoI may represent a defective memory cell (storing a single bit) 110 within an SRAM cache memory 106 in a microprocessor chip 100, as illustrated in FIGS. 1-3B. Next, in block 2604, a protective layer 708 is deposited—this corresponds to the FIB-assisted deposition process pictured in FIG. 7. Block 2606 then corresponds to the FIB milling of fiducial marks 806 and 808 shown in FIG. 8—these marks are used in subsequent blocks to enable precise repositioning of the focused ion beam with respect to the RoI, compensating for various sources of drift such as stage motion, voltage changes within the column control electronics, thermal expansion of the target, etc. A bulk milling process now starts in block 2608, where the FIB column is configured for a bulk milling mode—this constitutes setting up the required voltages on all the electrodes within the FIB column (lenses, blankers, and deflectors as illustrated in FIG. 13) corresponding to modes A-C. The specific choice of mode out of these three possible modes is then determined by the selection of a small diameter beam-defining aperture (BDA) in block 2610—this sets the column for mode B or C, giving smaller beam diameters at the target than are provided by the bulk milling mode A.

Now that the column has been configured to produce a coarse imaging beam 912 at the target 902 in blocks 2608 and 2610, an imaging process 910 as shown in FIG. 9 is initiated in block 2612, enabling the precise location (and relocation after path 2620) of fiducial marks 806 and 808 which were milled into the protective layer 708 in FIG. 8. Once the fiducial marks 806 and 808 have been imaged in block 2612, image processing may be used to determine the exact locations of the centers of fiducial marks 806 and 808 (as defined by the centers of the "X" patterns shown in FIG. 9, for example)—these locations then provide information to the FIB column controller to enable the bulk milling beam 1012 to be properly positioned for milling patterns 1016 and 1018 as shown in FIG. 10 (block 2616, below). After the fiducial mark locations have been determined in block 2612, a large diameter BDA is selected in block 2614, followed by a controlled amount of bulk milling with a high current beam in block 2616. Decision block 2618 is entered next, where a decision is made on whether bulk milling is complete—this is based on pre-determined bulk milling rates and the accumulated milling time. If bulk milling is not yet complete, path 2620 is followed back to block 2610 and the imaging/milling sequence in blocks 2610-2616 is repeated until decision block 2618 determines that bulk milling has been completed. Path 2622 is then taken to block 2624. The bulk milling process may generally correspond to the box milling procedure illustrated in FIGS. 10-11.

The fine milling process now begins with block 2624, where the FIB column is configured for fine milling—this step constitutes setting up the required voltages on all the electrodes within the FIB column (lenses, blankers, and deflectors as illustrated in FIG. 13) corresponding to operating modes D and E. The specific choice of operating mode out of these two possible modes is then determined by the selection of a small diameter beam-defining aperture (BDA) in block 2610—this sets the column for fine imaging mode E, giving smaller beam diameters at the target than are provided by the fine milling mode D.

Now that the column has been configured to produce a fine imaging beam 912 at the target 902 in blocks 2624 and 2626, an imaging process 910 such as that illustrated in FIG. 9 is initiated in block 2612, enabling the precise location (and relocation after path 2636) of the fiducial marks 806 and 808 which were milled into the protective layer 708 in FIG. 8. Once the image marks 806 and 808 have been imaged in block 2628, image processing may be used to determine the exact locations of the centers of fiducial marks 806 and 808 (as defined by the centers of the "X" patterns shown in FIG. 9, for example)—these locations then provide information to the FIB column controller to enable the fine milling beam 1208 to be properly positioned for cleaning milling as shown in FIG. 12 (block 2632, below). After the fiducial mark locations have been determined in block 2628, a middle diameter BDA is selected in block 2630, followed by a controlled period of fine milling with a middle current beam in block 2632. Decision block 2634 is entered next, where a decision is made on whether fine milling is complete—this decision is based on pre-determined fine milling rates. If fine milling is not yet complete, path 2636 is followed back to block 2626 and the imaging/milling sequence in blocks 2626-2632 is repeated until the decision block 2634 determines that fine milling has been completed. The fine milling process may generally correspond to the cleaning milling procedure illustrated in FIG. 12. Path 2638 is then taken to block 2640. Block 2640 comprises all the remaining FIB polishing steps needed to complete lamella preparation, including potentially lower voltage FIBs, and/or FIBs at various angles to assist in curtaining removal.

Although a few embodiments of the present invention and their advantages have been described in detail, it should be understood that various changes, substitutions and alterations can be made to the embodiments described herein without departing from the spirit and scope of the invention as defined by the appended claims. The voltage source for the grids may come from a single power source and use a voltage divider, separate power sources can be used for each grid, or some combination of voltage drivers and power sources may be used. While the examples provide an electric field to alter the trajectories of the secondary particles, a magnetic field could be used, although the effect of the magnetic field on the primary beam must be considered. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim:

1. A method for bulk processing and fine processing of structures in a target containing a region of interest using a focused ion beam system including an ion column and a multiplicity of beam-defining apertures, comprising:

selecting a first beam-defining aperture to produce an ion beam having a first current;

configuring electrode voltages in the ion column;

directing the ion beam having the first current onto the target;

selecting a second beam-defining aperture to produce an ion beam having a second current, the second current being greater than the first current;

directing the ion beam having the second current onto the target without reconfiguring the electrode voltages in the ion column;

deflecting the ion beam having the second current in a pre-determined pattern to perform bulk processing at the region of interest if the bulk processing is not complete, returning to the step of selecting a first beam-defining aperture and if the bulk processing is complete, then;

selecting a third beam-defining aperture for producing an ion beam having a third current less than the first beam current;

reconfiguring the electrode voltages in the ion column;

directing the ion beam having the third current onto the target;

selecting a fourth beam-defining aperture to produce an ion beam having a fourth current, the fourth current being greater than the third current and less than the first current;

directing the ion beam having the fourth current onto the target without reconfiguring the electrode voltages in the ion column;

deflecting the ion beam having the fourth current in a pre-determined pattern to perform a fine processing at the region of interest.

2. The method of claim 1 in which configuring electrode voltages in the ion column includes configuring the electrode voltages to optimize focusing the ion beam having the first current or second current onto the target.

3. The method of claim 1 in which reconfiguring electrode voltages in the ion column includes reconfiguring the electrode voltage to optimize focusing the ion beam having the third current or the fourth current onto the target.

4. The method of claim 1 in which configuring electrode voltages in the ion column include configuring electrode voltages between the electrode voltages optimized for focusing an ion beam having the first current and the electrode voltages optimized for focusing an ion beam having the second current.

5. The method of claim 1 in which re-configuring electrode voltages in the ion column include configuring electrode voltages between the electrode voltages optimized for focusing an ion beam having the third current and the electrode voltages optimized for focusing an ion beam having the fourth current.

6. The method of claim 1 in which:
selecting a first beam-defining aperture includes mechanically moving a first aperture of the multiplicity of apertures onto the axis of the ion column;
selecting a second beam-defining aperture includes mechanical moving a second aperture of the multiplicity of apertures onto the axis of the ion column;
selecting a third beam-defining aperture includes mechanically moving a third aperture of the multiplicity of apertures onto the axis of the ion column; and
selecting a fourth beam-defining aperture includes mechanical motion a fourth aperture of the multiplicity of apertures onto the axis of the ion column.

7. The method of claim 1 further comprising:
deflecting the ion beam using a first deflector above the multiplicity of beam-defining apertures; and
deflecting the ion beam using a second deflector below the multiplicity of beam-defining apertures.

8. The method of claim 7 in which:
selecting a first beam-defining aperture includes:
activating the first deflector to deflect the ion beam onto a first aperture of the multiplicity of beam-defining apertures; and
activating the second deflector to deflect the ion beam onto, and parallel to, the axis of the ion column;
selecting a second beam-defining aperture includes:
activating the first deflector to deflect the ion beam onto a second aperture of the multiplicity of beam-defining apertures; and
activating the second deflector to deflect the ion beam onto, and parallel to, the axis of the ion column;
the selecting a third beam-defining aperture includes:
activating the first deflector to deflect the ion beam onto a third aperture of the multiplicity of beam-defining apertures; and
activating the second deflector to deflect the ion beam onto, and parallel to, the axis of the ion column; and selecting a fourth beam-defining aperture includes:
activating the first deflector to deflect the ion beam onto a fourth aperture of the multiplicity of beam-defining apertures; and
activating the second deflector to deflect the ion beam onto, and parallel to, the axis of the ion column.

9. A method for processing a target using a focused ion beam system comprising an ion column and a multiplicity of beam-defining apertures, comprising:
selecting a first beam-defining aperture to produce an ion beam having a first current;
configuring focusing electrode voltages in the ion column for focusing the ion beam;
directing the ion beam having the first current onto the target;
selecting a second beam-defining aperture to produce an ion beam having a second current; and
directing the ion beam having the second current onto the target without reconfiguring the focusing electrode voltages in the ion column, eliminating settling time of the focusing electrode voltages.

10. The method of claim 9 in which configuring focusing electrode voltages in the ion column for focusing the ion beam including optimizing the focusing electrode voltages for focusing an ion beam having the first current or the second current.

11. The method of claim 9 in which configuring focusing electrode voltages in the ion column for focusing the ion beam includes configuring the focusing electrode voltages between the focusing electrode voltages optimized for focusing an ion beam having the first current and the focusing electrode voltages optimized for focusing an ion beam having the second current.

12. The method of claim 9, further comprising:
deflecting the ion beam having the second current in a pre-determined pattern to perform a processing at the region of interest.

13. The method of claim 12 further comprising re-selecting the first beam-defining aperture to produce the ion beam having the first current to image the target after deflecting the ion beam having the second current in a pre-determined pattern to perform processing at the region of interest.

14. The method of claim 12 further comprising:
selecting a third beam-defining aperture to produce an ion beam having a third current less than the first beam current;
re-configuring the focusing electrode voltages in the ion column;
directing the ion beam having the third current onto the target;
selecting a fourth beam-defining aperture to produce an ion beam having a fourth current, the fourth current being greater than the third current and less than the first current;
directing the ion beam having the fourth current onto the target without reconfiguring the focusing electrode voltages in the ion column; and
deflecting the ion beam having the fourth current in a pre-determined pattern to perform fine processing at the region of interest.

15. The method of claim 14 in which re-configuring the focusing electrode voltages in the ion column includes optimizing the focusing electrode voltages for an ion beam having the third current or the fourth current.

16. The method of claim 14 in which re-configuring the focusing electrode voltages in the ion column includes setting the focusing electrode voltages to values between the optimized focusing electrode voltages for an ion beam having the third current and the optimized focusing electrode voltages for an ion beam having the fourth current.

17. The method of claim 14 further comprising re-selecting the third beam-defining aperture to produce the ion beam having the third current to image the target after deflecting the ion beam having the fourth current in a pre-determined pattern to perform the fine processing at the region of interest.

18. The method of claim 1 in which:
selecting a first beam-defining aperture includes mechanical motion of a first aperture of the multiplicity of apertures onto the axis of the ion column; and
selecting a second beam-defining aperture includes mechanical motion of a second aperture of the multiplicity of apertures onto the axis of the ion column.

19. The method of claim 14 in which:
selecting a first beam-defining aperture includes mechanical motion of a first aperture of the multiplicity of apertures onto the axis of the ion column;
selecting a second beam-defining aperture includes mechanical motion of a second aperture of the multiplicity of apertures onto the axis of the ion column;
selecting a third beam-defining aperture includes mechanical motion of a third aperture of the multiplicity of apertures onto the axis of the ion column; and
selecting a fourth beam-defining aperture includes mechanical motion of a fourth aperture of the multiplicity of apertures onto the axis of the ion column.

20. The method of claim 12 further comprising:
deflecting the ion beam using a first deflector positioned above the multiplicity of beam-defining apertures; and
deflecting the ion beam using a second deflector below the multiplicity of beam-defining apertures.

21. The method of claim 20 in which:
selecting a first beam-defining aperture includes:
activating the first deflector to deflect the ion beam onto a first aperture of the multiplicity of beam-defining apertures; and
activating the second deflector to deflect the ion beam onto, and parallel to, the axis of the ion column; and
selecting a second beam-defining aperture includes:
activating the first deflector to deflect the ion beam onto a second aperture of the multiplicity of beam-defining apertures; and
activating the second deflector to deflect the ion beam onto, and parallel to, the axis of the ion column.

22. The method of claim 12, further comprising polishing the work piece using the ion beam after processing the work piece.

* * * * *